United States Patent

(12) United States Patent
Hiroki

(10) Patent No.: US 7,902,845 B2
(45) Date of Patent: Mar. 8, 2011

(54) INSPECTION METHOD AND INSPECTION APPARATUS

(75) Inventor: Masaaki Hiroki, Kanagawa (JP)

(73) Assignee: Semiconductor Energy laboratory Co., Ltd. (JP)

( * ) Notice: Subject to any disclaimer, the term of this patent is extended or adjusted under 35 U.S.C. 154(b) by 14 days.

(21) Appl. No.: 12/437,708

(22) Filed: May 8, 2009

(65) Prior Publication Data
US 2009/0212792 A1 Aug. 27, 2009

Related U.S. Application Data

(60) Continuation of application No. 11/041,089, filed on Jan. 21, 2005, now Pat. No. 7,532,018, which is a division of application No. 10/100,668, filed on Mar. 18, 2002, now Pat. No. 6,850,080.

(30) Foreign Application Priority Data

Mar. 19, 2001 (JP) ............................. 2001-079598

(51) Int. Cl.
G01R 31/36 (2006.01)
(52) U.S. Cl. .............................. 324/750.15; 324/760.02
(58) Field of Classification Search .............. 324/158.1, 324/750–758, 760–765, 770; 438/14, 17, 438/18
See application file for complete search history.

(56) References Cited

U.S. PATENT DOCUMENTS 3,311,818 A 3/1967 Quittner
4,983,911 A 1/1991 Henley
5,097,201 A 3/1992 Henley
5,124,635 A 6/1992 Henley
5,266,869 A 11/1993 Usami
5,424,633 A 6/1995 Soiferman (Continued)

FOREIGN PATENT DOCUMENTS

EP 1 005 093 A2 5/2000

(Continued)

OTHER PUBLICATIONS

Aoshima, S. et al, "Improvement of the Minimum Detectability of Electro-Optic Sampling by Using a Structurally New Probe," OSA Proceedings on Picosecond Electronics and Optoelectronics, vol. 9, 1991, pp. 64-69.

(Continued)

Primary Examiner—Ha Tran T Nguyen
Assistant Examiner—Trung Q Nguyen
(74) Attorney, Agent, or Firm—Husch Blackwell LLP

(57) ABSTRACT

There is established an easier inspection method with which it is not required to set up probes on wires. Also, there is provided an inspection apparatus using this inspection method. With the inspection apparatus or inspection method, primary coils of an inspection substrate and secondary coils of a device substrate are superimposed on each other so that a certain space is maintained therebetween. An AC signal is inputted into the primary coils, thereby generating an electromotive force in each secondary coil by electromagnetic induction. Then, each circuit provided on the device substrate is driven using the electromotive force and information possessed by an electromagnetic wave or electric field generated in this circuit is monitored, thereby detecting each defective spot.

34 Claims, 17 Drawing Sheets

U.S. PATENT DOCUMENTS

| | | |
|---|---|---|
| 5,428,521 A | 6/1995 | Kigawa et al. |
| 5,517,110 A | 5/1996 | Soiferman |
| 5,543,729 A | 8/1996 | Henley |
| 5,631,818 A | 5/1997 | Johnson et al. |
| 5,643,804 A | 7/1997 | Arai et al. |
| 5,837,971 A | 11/1998 | Lee |
| 5,854,492 A | 12/1998 | Chinone et al. |
| 6,184,696 B1 | 2/2001 | White et al. |
| 6,236,383 B1 | 5/2001 | Nakajima et al. |
| 6,249,673 B1 | 6/2001 | Tsui |
| 6,294,909 B1 | 9/2001 | Leedy |
| 6,321,067 B1 | 11/2001 | Suga et al. |
| 6,365,917 B1 | 4/2002 | Yamazaki |
| 6,407,546 B1 | 6/2002 | Le et al. |
| 6,410,960 B1 | 6/2002 | Arai et al. |
| 6,427,065 B1 | 7/2002 | Suga et al. |
| 6,496,166 B1 | 12/2002 | Onozawa et al. |
| 6,512,482 B1 | 1/2003 | Nelson et al. |
| 6,686,755 B2 | 2/2004 | White et al. |
| 6,753,257 B2 | 6/2004 | Yamazaki |
| 6,759,850 B2 | 7/2004 | Harzanu et al. |
| 6,850,080 B2 | 2/2005 | Hiroki |
| 6,891,391 B2 | 5/2005 | Hiroki |
| 6,930,047 B2 | 8/2005 | Yamazaki et al. |
| 6,930,744 B1 | 8/2005 | Ukita |
| 6,949,767 B2 | 9/2005 | Yamazaki |
| 6,999,154 B2 | 2/2006 | Choo et al. |
| 7,009,405 B2 | 3/2006 | Bae et al. |
| 7,105,365 B2 | 9/2006 | Hiroki et al. |
| 7,112,952 B2 * | 9/2006 | Arai et al. ............... 324/158.1 |
| 7,151,015 B2 * | 12/2006 | Suzawa et al. ............. 438/149 |
| 7,250,781 B2 | 7/2007 | Nakagawa et al. |
| 7,256,055 B2 | 8/2007 | Aghababazadeh et al. |
| 7,276,929 B2 | 10/2007 | Arai et al. |
| 7,378,837 B2 | 5/2008 | Andarawis et al. |
| 2002/0084967 A1 | 7/2002 | Akimoto et al. |
| 2002/0085138 A1 | 7/2002 | Kim et al. |
| 2002/0130675 A1 | 9/2002 | Hiroki |
| 2002/0132383 A1 | 9/2002 | Hiroki et al. |
| 2002/0167303 A1 | 11/2002 | Nakano |
| 2002/0173060 A1 | 11/2002 | Hiroki |
| 2003/0146771 A1 | 8/2003 | Moore |
| 2005/0057242 A1 | 3/2005 | Swain |
| 2005/0212044 A1 | 9/2005 | Hiroki |
| 2005/0218926 A1 | 10/2005 | Hiroki |
| 2006/0091387 A1 | 5/2006 | Yamazaki |
| 2006/0263952 A1 | 11/2006 | Hiroki et al. |
| 2008/0024156 A1 | 1/2008 | Arai et al. |

FOREIGN PATENT DOCUMENTS

| | | |
|---|---|---|
| JP | 61-226887 | 10/1986 |
| JP | 4-138584 | 5/1992 |
| JP | 5-119356 | 5/1993 |
| JP | 5-264461 | 10/1993 |
| JP | 5-314786 | 11/1993 |
| JP | 6-349913 | 12/1994 |
| JP | 7-142253 | 6/1995 |
| JP | 8-101404 | 4/1996 |
| JP | 10-201088 | 7/1998 |
| JP | 11-44724 | 2/1999 |
| JP | 11-174106 | 7/1999 |
| JP | 11-353433 | 12/1999 |
| JP | 2000-163543 | 6/2000 |
| JP | 2000-200053 | 7/2000 |
| JP | 2000-258482 | 9/2000 |
| JP | 2000-269507 | 9/2000 |
| JP | 2001-43980 | 2/2001 |
| JP | 2001-51655 | 2/2001 |
| WO | WO 91/12534 A1 | 8/1991 |
| WO | WO 91/12536 A1 | 8/1991 |
| WO | WO 92/15021 A1 | 9/1992 |
| WO | WO 99/32893 A1 | 7/1999 |
| WO | WO 01/88976 A2 | 11/2001 |
| WO | WO 02/063675 A1 | 8/2002 |

OTHER PUBLICATIONS

Takahashi, H. et al, "Improvement of Space-Dependent Sensitivity and Absolute Voltage Measurement in Noncontact Picosecond Electro-Optic Sampling," OSA Proceedings on Picosecond Electronics and Optoelectronics, vol. 9, 1991, pp. 70-74.

Aoshima, S. et al, "Internal Test of MMIC with E-O Sampling," 1993 Microwave Workshops and Exhibition, Microwave Workshop Digest, 1993, pp. 77-82.

Hui, S.Y. et al, "Coreless Printed Circuit Board (PCB) Transformers—Fundamental Characteristics and Application Potential," IEEE Circuits and Systems, vol. 11, No. 3, Third Quarter, 2000, pp. 3-15.

Finkenzeller, K., *RFID Handbook*, Taihei Kanno, pub. Nikkan Kogyo Shimbum, Tokyo, Japan, Feb. 26, 2001, p. 35, (with English translation, pp. 1-3).

Office Action re Japanese application No. JP 2007-032820, dated May 25, 2010 (with English translation).

* cited by examiner

INSPECTION METHOD AND INSPECTION APPARATUS

This application is a continuation of U.S. application Ser. No. 11/041,089 filed on Jan. 21, 2005, now U.S. Pat. No. 7,532,018 which is a divisional of U.S. application Ser. No. 10/100,668 filed on Mar. 18, 2002 (now U.S. Pat. No. 6,850,080 issued Feb. 1, 2005).

BACKGROUND OF THE INVENTION

1. Field of the Invention

The present invention relates to an inspection apparatus used for a device substrate of a semiconductor device and to an inspection method using the inspection apparatus. More particularly, the present invention relates to an inspection apparatus of non-contact type and an inspection method using the inspection apparatus.

2. Description of the Related Art

In recent years, attentions have been given to a technique of forming a thin-film transistor (TFT) using a semiconductor film (whose thickness is about several nm to several hundred nm) formed on a substrate having an insulating surface. This is because there is increasing demand for an active matrix semiconductor display device that is one type of semiconductor devices. Typical examples of the active matrix semiconductor display device include a liquid crystal display, an OLED (organic light emitting device) display, and a DMD (digital micromirror device).

It is possible to obtain a high mobility with a TFT (crystalline TFT) that uses a semiconductor film having a crystal structure as an active layer. Therefore, it is possible to realize an active matrix semiconductor display device that performs high-definition image display by integrating functional circuits on the same substrate.

By the way, the active matrix semiconductor display device is obtained through various manufacturing steps. In the case of an active matrix liquid crystal display, for instance, there are mainly included a pattern forming step for forming a semiconductor film and performing pattern formation, a color filter forming step for realizing colorization, a cell assembling step for forming a liquid crystal panel by sealing a liquid crystal between a device substrate having an element including a semiconductor and an opposing substrate having an opposing electrode, and a module assembling step for finishing the liquid crystal panel as a liquid crystal display by attaching driving parts for driving the liquid crystal panel and a backlight to the liquid crystal panel assembled in the cell assembling step.

The manufacturing steps described above also include an inspection step, although this inspection step differs to some extent depending on which type of the liquid crystal display will be produced. If it is possible to find defective items at an early stage in the manufacturing steps before the liquid crystal display is finished as a product, it becomes possible to omit the following manufacturing steps for each of the defective panels. Accordingly, the inspection step is an extremely effective means from the viewpoint of cost reduction.

One type of the inspection step included in the pattern forming step is a defect inspection that is performed after the pattern formation.

The defect inspection after the pattern formation means an inspection for detecting each spot, in which a malfunction occurs due to variations in the width of a semiconductor film pattern, insulating film pattern, or wire pattern (hereinafter simply referred to as the "pattern"), after the pattern formation. Alternatively, the defect inspection means an inspection for detecting each spot in which wire breaking or a short circuit occurs due to dust or a film formation failure. Also, in some cases, the defect inspection means an inspection for confirming whether a circuit or a circuit element that is an inspection target operates normally.

Such defect inspections are broadly divided into an optical inspection method and a probe inspection method.

The optical inspection method refers to an inspection method with which a pattern formed on a substrate is read using a CCD or the like and each defect is identified by comparing the read pattern with a reference pattern. Also, the probe inspection method means an inspection method with which minute pins (probes) are set up on terminals on the substrate side and each defect is identified with reference to the magnitude of a current or a voltage flowing between the probes. In general, the former method is called the "non-contact type inspection method", while the latter method is called the "sensing pin type inspection method".

It is possible to detect each defect of a device substrate regardless of which method described above is used. However, each of the inspection methods described above has a shortcoming.

In the case of the optical inspection method, if an inspection is performed after the formation of several pattern layers is finished, it becomes difficult to identify patterns formed as lower layers and therefore it is difficult to detect each defective spot. However, if an inspection is performed each time a pattern is formed, the inspection step itself becomes complicated and the time taken by the whole manufacturing steps is elongated. Also, in the case of the probe inspection method, probes are directly set up on wires, so that there may be cases where the wires are damaged and minute dust is caused. The dust caused in the inspection step becomes a factor for the reduction of yield in the following steps and therefore is not preferable.

SUMMARY OF THE INVENTION

In view of the problems described above, an object of the present invention is to establish an easier inspection method, with which it is not required to set up probes on wires, and to provide an inspection apparatus that uses the inspection method.

The inventors of the present invention have conceived that it becomes possible to have a current flow through a wire of a device substrate without setting up probes by generating an electromotive force in the wire by means of electromagnetic induction.

In more detail, a substrate for inspection (inspection substrate) that will be used to inspect a device substrate is separately prepared. The inspection substrate includes primary coils, while the device substrate that is an inspection target includes secondary coils.

It should be noted here that the primary coils and the secondary coils are both formed by patterning a conductive film formed on a substrate. Also, in the present invention, the primary coils and the secondary coils are not coils having a structure where a magnetic substance is provided at the center as a magnetic path but are coils having a structure where a magnetic substance is not provided at the center. Of course, coils having a structure where magnetic substance is provided at the center can be used.

Then, the primary coils of the inspection substrate and the secondary coils of the device substrate are superimposed on each other so that a certain space is maintained therebetween. Following this, an electromotive force is generated between two terminals of each secondary coil by applying an AC voltage between two terminals of each primary coil. Note that it is preferable that this space is reduced as much as possible and a primary coil forming unit and a secondary coil forming unit are positioned so that a space between them is reduced as much as possible to the extent that the space can be controlled.

Also, an AC voltage that is an electromotive force generated in each secondary coil is rectified on the device substrate and then appropriately flattened. In this manner, it becomes possible to use the AC voltage as a DC voltage (hereinafter referred to as the "power supply voltage") for driving circuits or circuit elements of the device substrate. Also, as to an AC voltage that is an electromotive force generated in each secondary coil, the waveform of the AC voltage is appropriately rectified using a waveform shaping circuit or the like. As a result, it becomes possible to use this AC voltage as a signal (hereinafter referred to as the "driving signal") for driving circuits or circuit elements of the device substrate.

Then, this driving signal or power supply voltage is inputted into wires of the device substrate.

The circuits or circuit elements formed on the substrate are driven by the driving signal or power supply voltage inputted into the leading wires. When the circuits or circuit elements are driven, a weak electromagnetic wave or electric field is generated in each circuit or circuit element. By monitoring information possessed by this weak electromagnetic wave or electric field, it becomes possible to detect each spot, out of the plurality of circuits or circuit elements, that does not operate normally.

It should be noted here that it is possible to collect the information possessed by the electromagnetic wave or electric field in various dimensions, such as a frequency, phase, strength, and time. In the present invention, it is possible to use any kind of information among various information possessed by an electromagnetic wave or electric field so long as it is possible to detect each spot, out of a plurality of circuits or circuit elements, that does not operate normally.

It should be noted here that any publicly known method may be used to monitor a weak electromagnetic wave or electric field generated in each circuit or circuit element.

With the present invention, there is realized the structures described above. Therefore, it becomes possible to detect each defective spot without directly setting up probes on wires. As a result, there is prevented the reduction of yield in the following steps due to minute dust caused by the setting up of probes. In addition, unlike the optical inspection method, it becomes possible to judge whether all of pattern forming steps have been successfully done by a single inspection step. As a result, the inspection step is further simplified.

DETAILED DESCRIPTION OF THE PREFERRED EMBODIMENTS

Figure 1A:
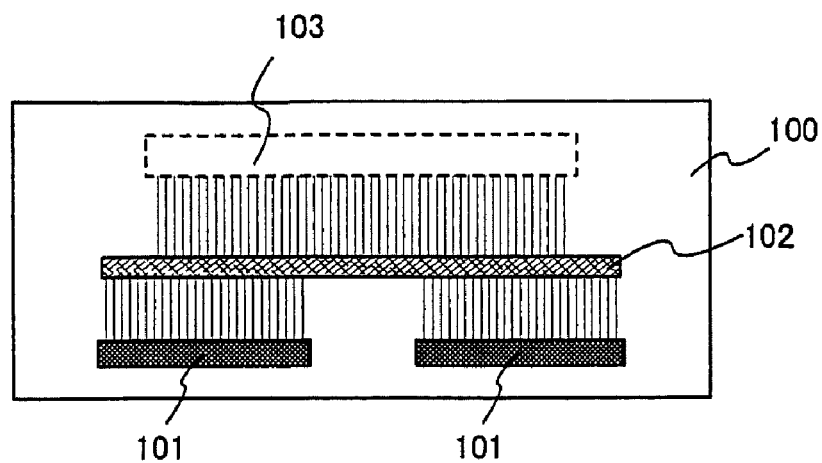
FIGS. 1A and 1B are a top view of an inspection substrate and a top view of a device substrate, respectively.
Figure 1B:
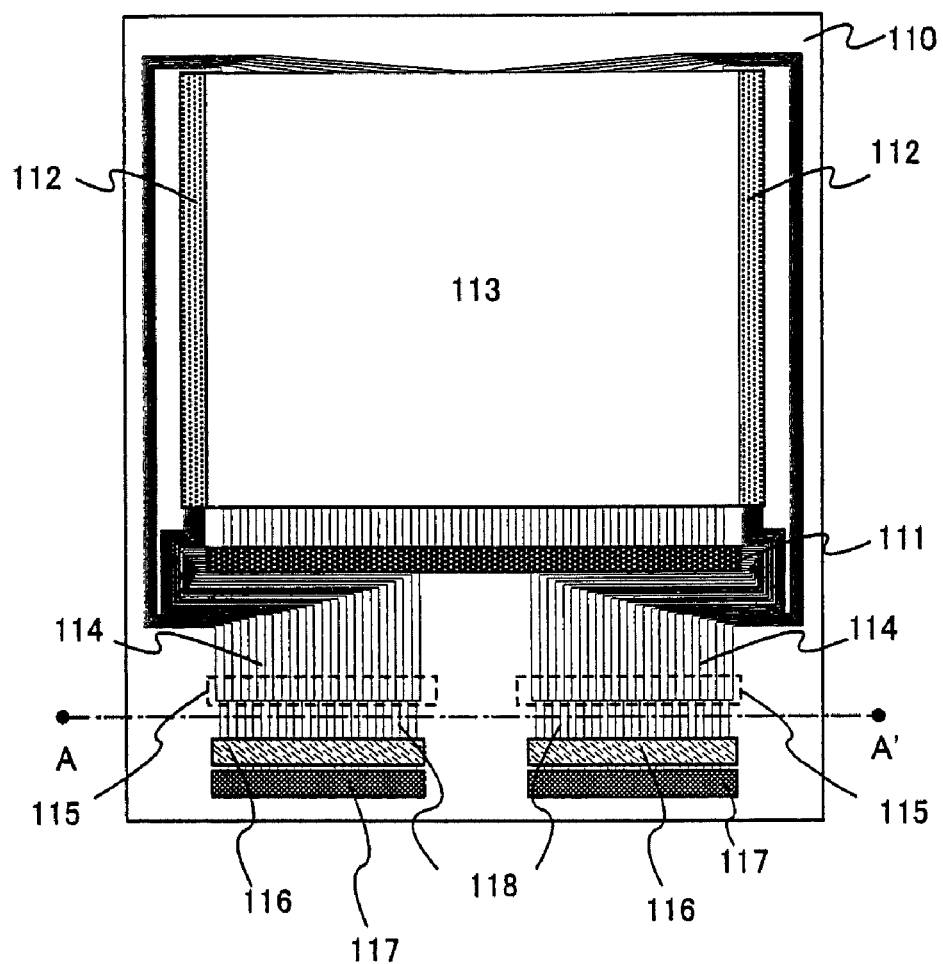

FIG. 1A is a top view of an inspection substrate for performing an inspection of the present invention. Also, FIG. 1B is a top view of a device substrate to be inspected with an inspection method. Note that in this embodiment, the inspection method of the present invention will be described by taking, as an example, a device substrate of a liquid crystal display. However, the usage of the inspection method of the present invention is not limited to the liquid crystal display but it is possible to apply the inspection method to any other semiconductor devices so long as the semiconductor devices are formed using semiconductors.

As to the inspection substrate shown in FIG. 1A, primary coil forming units 101, external input buffer 102, and a connector connecting unit 103 are provided on a substrate 100. Note that in this specification, the inspection substrate includes the substrate 100 and all of circuits or circuit elements formed on the substrate 100.

As to the device substrate shown in FIG. 1B, a signal line driving circuit 111, scanning line driving circuits 112, a pixel unit 113, leading wires 114, connector connecting units 115, waveform shaping circuits or rectifier circuits 116, secondary coil forming units 117, and coil wires 118 are provided on a substrate 110. Note that in this specification, the device substrate includes the substrate 110 and all of circuits or circuit elements formed on the substrate 110. Also, note that the leading wires 114 are wires for supplying driving signals or power supply voltages to the pixel unit and the driving circuits provided on the device substrate.

To each connector connecting unit 115, an FPC, a TAB, or the like is connected in a step after an inspection step. Note that after the inspection step is finished, the device substrate is divided along the dotted line A-A' so that the coil wires 118 are physically and electrically separated.

Next, the operation performed for the device substrate and the inspection substrate in the inspection step will be described. Note that to make it easy to understand the flows of signals in the inspection step, the structures of the device substrate and the inspection substrate shown in FIGS. 1A and 1B are shown in the block diagram in FIG. 2. The structures of the device substrate and the inspection substrate will be described with reference to FIGS. 1A, 1B, and 2.

On the inspection substrate 203, an AC signal for inspection is inputted from a signal source 201 or an AC power supply 202 into the external input buffer 102 via a connector connected to the connector connecting unit 103. The AC signal for inspection is buffer-amplified in the external input buffer 102 and is inputted into the primary coil forming unit 101.

Figure 2:
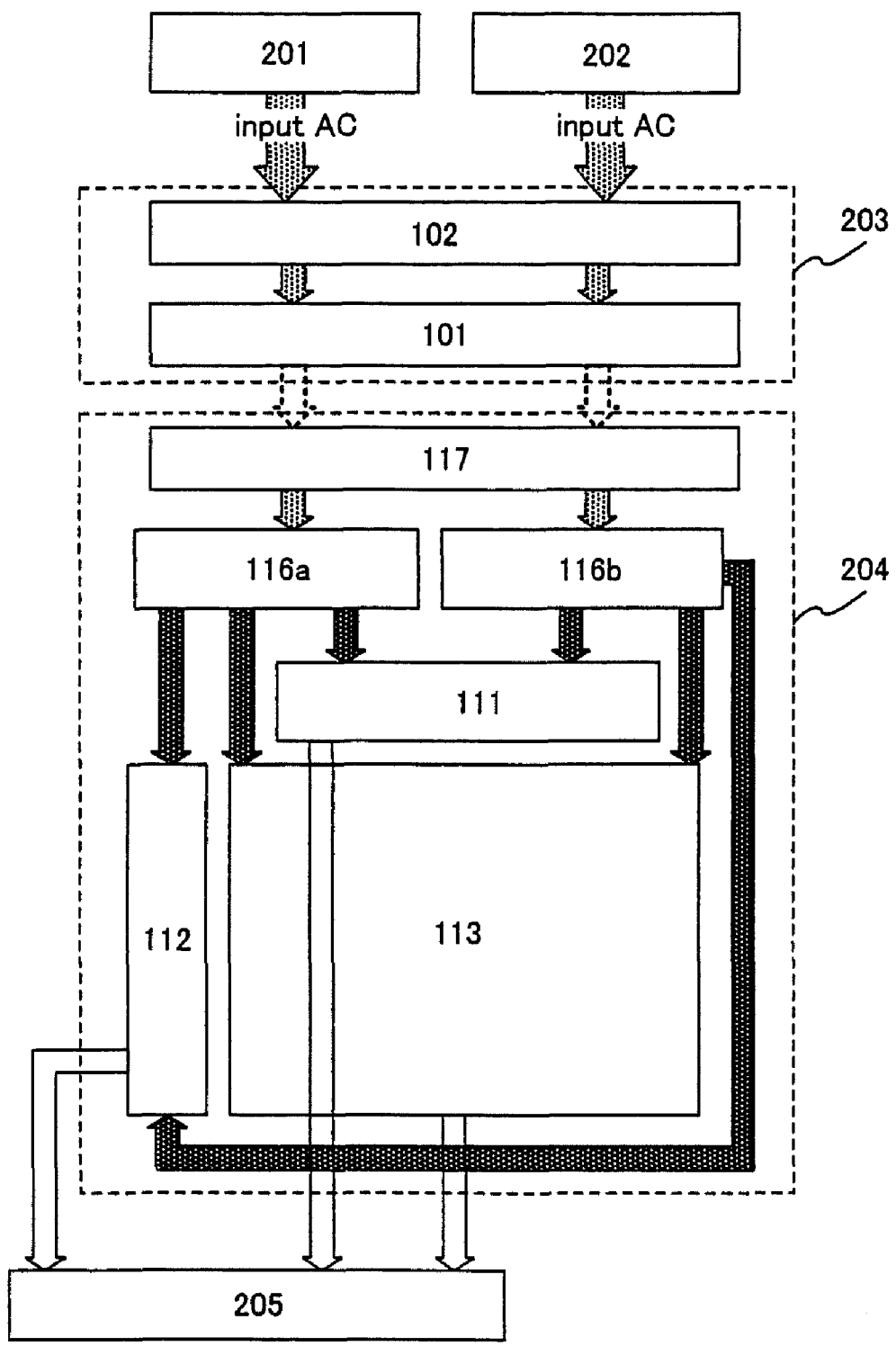
FIG. 2 is a block diagram of the inspection substrate and the device substrate.

It should be noted here that in FIGS. 1A and 2, the inputted AC signal is buffer-amplified in the external input buffer 102 and is inputted into the primary coil forming unit 101, although the present invention is not limited to this structure. The AC signal may be directly inputted into the primary coil forming unit 101 without providing the external input buffer 102.

In the primary coil forming unit 101, there are formed a plurality of primary coils. The AC signal is inputted into each primary coil.

On the other hand, in the secondary coil forming unit 117 of the device substrate 204, there are formed a plurality of secondary coils corresponding to the plurality of primary coils of the primary coil forming unit 101. When an AC signal is inputted into each primary coil, an AC voltage that is an electromotive force is generated between two terminals of each secondary coil by electromagnetic induction.

The AC voltage generated in each secondary coil is supplied to a waveform shaping circuit 116a or a rectifier circuit 116b. In the waveform shaping circuit 116a or the rectifier circuit 116b, the AC voltage is shaped or rectified, thereby generating a driving signal or a power supply voltage.

The generated driving signal or power supply voltage is inputted into the leading wires 114 via the coil wires 118. The inputted driving signal, power supply voltage, or the like is supplied to the signal line driving circuit 111, the scanning line driving circuit 112, and the pixel unit 113 via the leading wires 114.

It should be noted here that a plurality of pixels are formed in the pixel unit 113 and a pixel electrode is formed in each pixel. Note that the number of the signal line driving circuits and the number of the scanning line driving circuits are not limited to those shown in FIGS. 1A and 2.

When a driving signal, power source voltage, or the like is inputted into the signal line driving circuit 111, the scanning line driving circuit 112, or the pixel unit 113, an electromagnetic wave or an electric field is generated in each circuit or circuit element of the signal line driving circuit 111, the scanning line driving circuit 112, or the pixel unit 113.

The strength of the electric field and the electromagnetic wave generated in each defective circuit or circuit element greatly differs from the strength of an electric field and an electromagnetic wave generated in each normal circuit or circuit element. As a result, it becomes possible to track down each defective spot by monitoring the strength of the electromagnetic wave and the electric field generated in each circuit or circuit element. In FIG. 2, an inspection unit 205 detects each defective spot by measuring the strength of the electric field or the electromagnetic wave.

Also, the output from each circuit that is an inspection target may be inputted into a circuit dedicated to inspection (hereinafter, then "inspection dedicated circuit") and the strength of an electric filed or electromagnetic wave generated in the inspection dedicated circuit may be measured, thereby judging the presence or absence of defects or identifying each defective spot itself.

In the case where the inspection dedicated circuit is used, a pixel dedicated to inspection (dummy pixel) that is not used for the actual display may be provided in the pixel unit and the output from a circuit or circuit element in the pixel dedicated to inspection may be inputted into the inspection dedicated circuit. This is not limited to the pixel unit and it is not required to input the outputs from all circuits or circuit elements of the device substrate into the inspection dedicated circuit. That is, some of the circuits or circuit elements may be selected and the outputs from the selected circuits or circuit elements may be inputted into the inspection dedicated circuit. Also, a dummy circuit or circuit element dedicated to inspection that is not used for the actual driving may be formed and the output from the circuit or circuit element dedicated to inspection may be inputted into the inspection dedicated circuit.

It should be noted here that it does not matter which method is used to monitor an electromagnetic wave and an electric field so long as the method has a sensitivity with which it is possible to detect the defects of circuits or circuit elements.

Figure 3A:
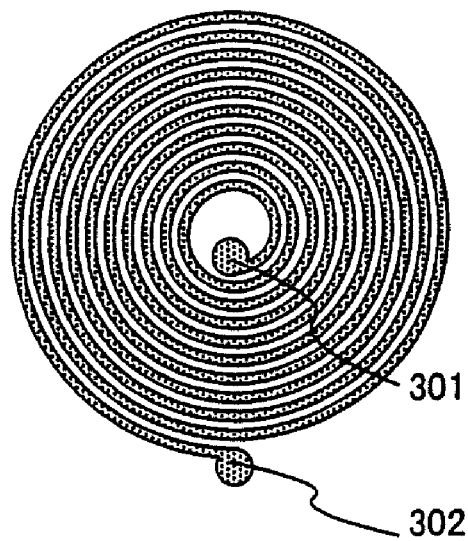
FIGS. 3A and 3B are each an enlarged view of a coil.
Figure 3B:
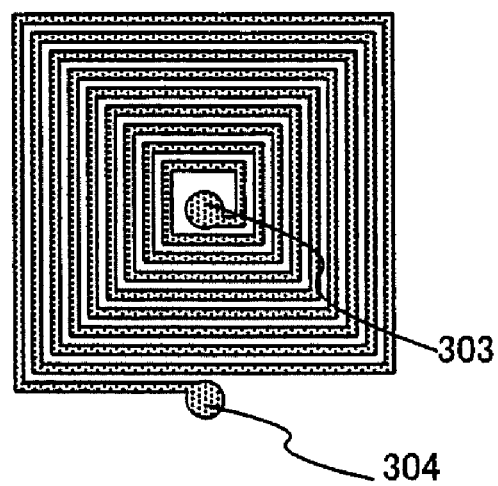

Next, the detailed structures of the primary coil forming unit and the secondary coil forming unit (hereinafter collectively referred to as the "coil forming unit") will be described. FIGS. 3A and 3B are each an enlarged view of a coil.

The coil shown in FIG. 3A is spirally wounded while drawing curves and coil terminals 301 and 302 are formed at both ends of the coil. Also, the coil shown in FIG. 3B is spirally wounded while drawing rectangles and coil terminals 303 and 304 are formed at both ends of the coil.

It should be noted here that it is enough that each coil used in the present invention has a shape where the wire of the coil is wholly formed in the same plane and is spirally wounded. Consequently, if viewed in a direction perpendicular to the plane on which the coil is formed, it does not matter whether the wire of the coil draws curves or a shape having corners.

Also, it is possible for a designer to appropriately set the number of turns of the coil, the line width thereof, and an area on the substrate occupied by the coil.

Figure 4A:
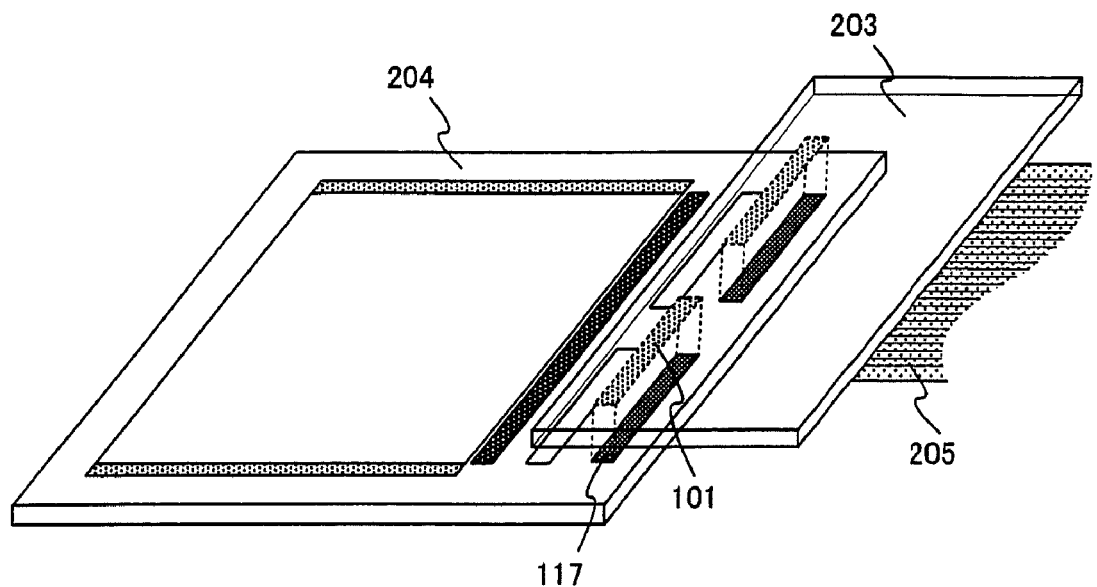
FIGS. 4A and 4B are each a perspective view of the inspection substrate and the device substrate during an inspection.

Next, a state where the device substrate having the coil shown in FIG. 3A as a primary coil and the inspection substrate, which similarly has the coil shown in FIG. 3A as a secondary coil, are superimposed on each other is shown in FIG. 4A. Note that reference numeral 205 denotes an FPC that connects the inspection substrate 203 to the signal source and the AC power supply.

As shown in FIG. 4A, each primary coil forming unit 101 of the inspection substrate 203 and each secondary coil forming unit 117 of the device substrate 204 are superimposed on each other so that a certain space is maintained therebetween. Note that it is preferable that this space is reduced as much as possible and the primary coil forming unit 101 and the secondary coil forming unit 117 of the device substrate 204 are positioned as close to each other as possible to the extent that this space can be controlled.

It should be noted here that the space between the inspection substrate 203 and the device substrate 204 may be maintained by fixing these substrates or be maintained by fixing the device substrate 204 and having a liquid or a gas flow between the inspection substrate 203 and the device substrate 204 at a constant flow rate or under a constant pressure.

Figure 4B:
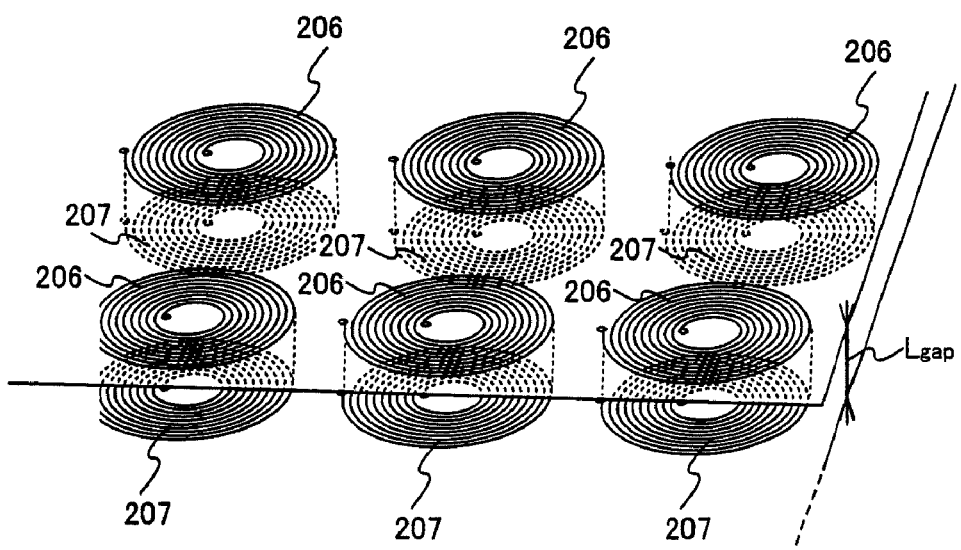

An enlarged view of a portion, in which the primary coil forming unit 101 and the secondary coil forming unit 117 are superimposed on each other, is shown in FIG. 4B. Reference numeral 206 denotes the primary coils and reference numeral 207 represents the secondary coils.

The primary coils 206 and the secondary coils 207 are formed so that the wires thereof are spirally wounded in the same direction, although the present invention is not limited to this structure. That is, there occurs no problem even if the winding direction of the primary coils is opposite to the winding direction of the secondary coils.

Also, it is possible for a designer to appropriately set the space between the primary coils and the secondary coils ($L_{gap}$).

Next, the detailed structure of the waveform shaping circuit 116a shown in FIG. 2 will be described.

Figure 5:
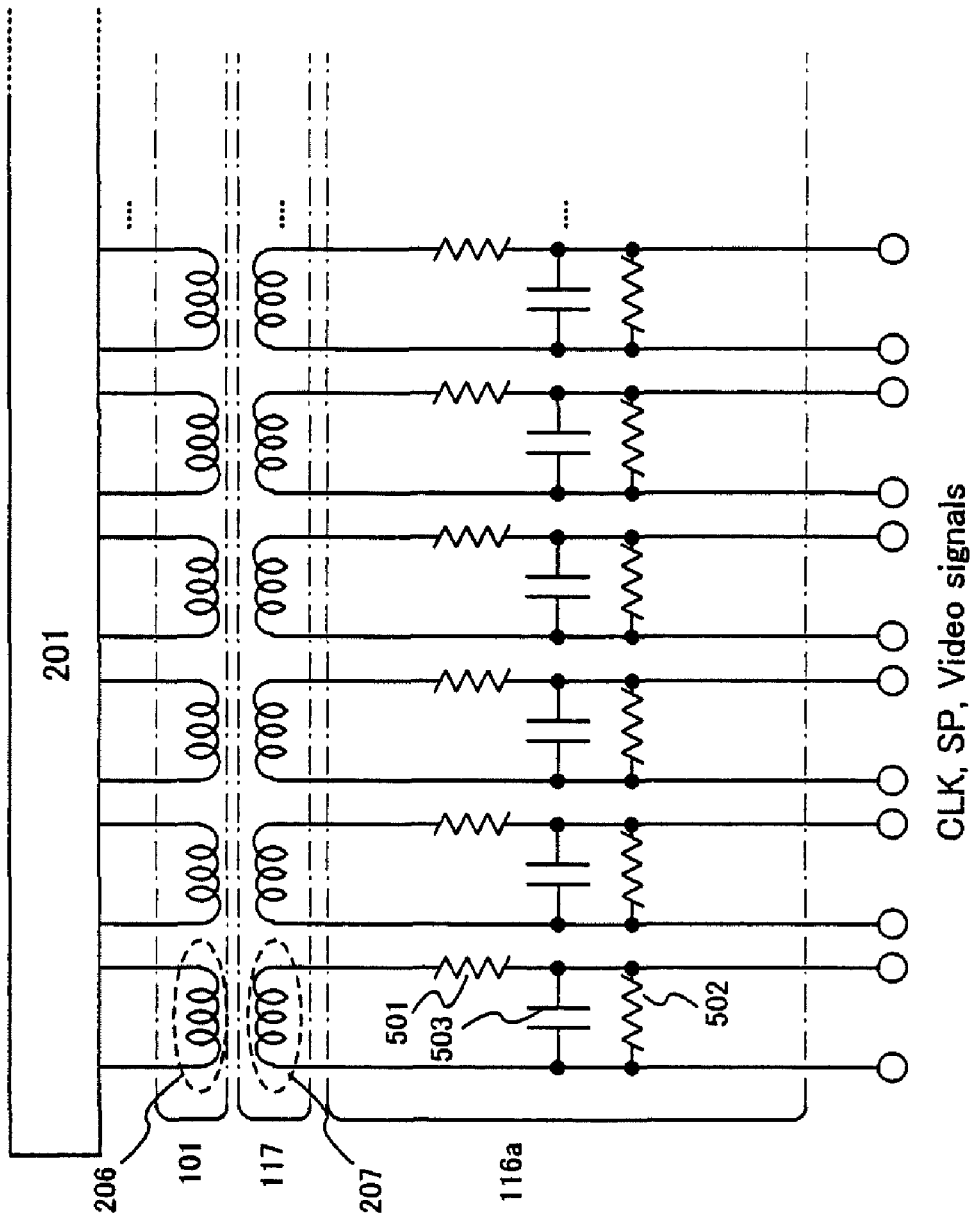
FIG. 5 is a circuit diagram of a waveform shaping circuit.

FIG. 5 shows a state where the signal source 201, the primary coil forming unit 101, the secondary coil forming unit 117, and the waveform shaping circuit 116a shown in FIGS. 1A, 1B, and 2 are connected to each other. A plurality of primary coils 206 are provided in the primary coil forming unit 101, while a plurality of secondary coils 207 are provided in the secondary coil forming unit 117.

An AC signal for inspection is inputted from the signal source 201 into each primary coil 206. When the AC signal is inputted into the primary coil 206, an AC voltage that is an electromotive force is generated in a corresponding secondary coil 207 and this AC voltage is applied to the waveform shaping circuit 116a.

The waveform shaping circuit 116a is an electronic circuit that is used to shape or rectify the changing amount over time, which is to say the waveform of a voltage, a current, or the like. In FIG. 5, the waveform shaping circuit 116a includes resistors 501 and 502 and capacitors 503 and forms an integration type waveform shaping circuit 116a by assembling each circuit element. Needless to say, the waveform shaping circuit is not limited to the structure shown in FIG. 5. Also, like a power circuit, a waveform shaping operation may be performed using a detector circuit that uses a diode. The waveform shaping circuit 116a used in the present invention generates and outputs, specifically, a clock signal (CLK), a start pulse signal (SP), and a video signal (Video signals) from an inputted AC electromotive force. Note that the signals outputted from the waveform shaping circuit 116a are not limited to those described above. That is, any other signals having different waveforms may be outputted so long as it is possible to generate, in the circuit or circuit element of the device substrate, an electromagnetic wave or an electric field with which it is possible to identify each defective spot through monitoring.

The signals outputted from the waveform shaping circuit 116a are inputted into circuits in subsequent stages (in FIGS. 1A, 1B, and 2, the signal line driving circuit 111, the scanning line driving circuit 112, and the pixel unit 113).

Next, the detailed structure of the rectifier circuit 116b shown in FIG. 2 will be described.

Figure 6:
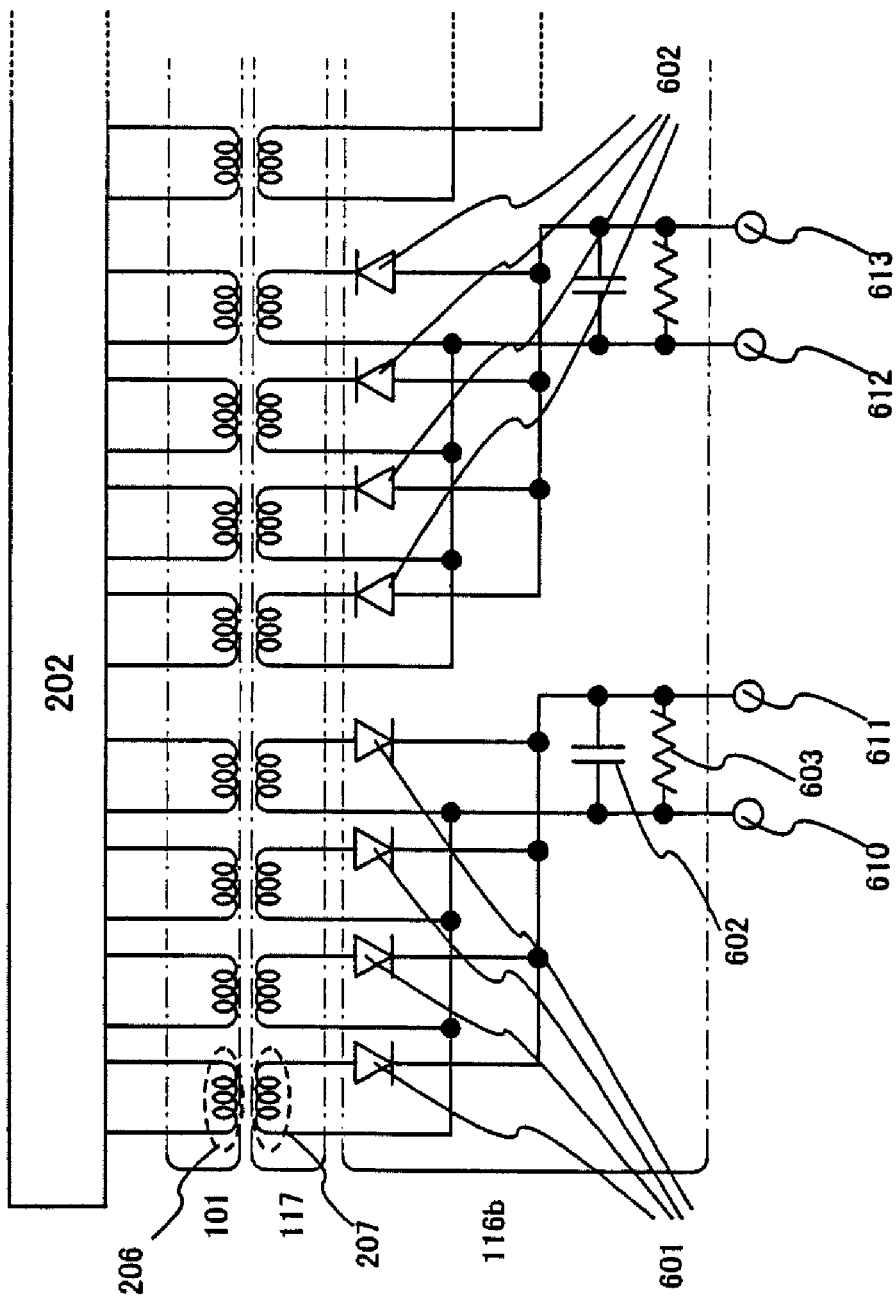
FIG. 6 is a circuit diagram of a rectifier circuit.

FIG. 6 shows a state where the AC power supply 202, the primary coil forming unit 101, the secondary coil forming unit 117, and the rectifier circuit 116b shown in FIGS. 1A, 1B, and 2 are connected to each other. A plurality of primary coils 206 are provided in the primary coil forming unit 101, while a plurality of secondary coils 207 are provided in the secondary coil forming unit 117.

An AC signal for inspection is inputted from the AC power supply 202 into each primary coil 206. When the AC signal is inputted into the primary coil 206, an AC voltage that is an electromotive force is generated in a corresponding secondary coil 207 and this AC voltage is applied to the rectifier circuit 116b.

It should be noted here that in the present invention, the rectifier circuit means a circuit that generates a DC power supply voltage from the supplied AC voltage. Note that the DC power supply voltage means a voltage whose height is maintained constant.

The rectifier circuit 116b shown in FIG. 6 includes diodes 601, capacitors 602, and resistors 603. Each diode 601 rectifies the inputted AC voltage and converts it into a DC voltage.

Figures 7A, 7B:
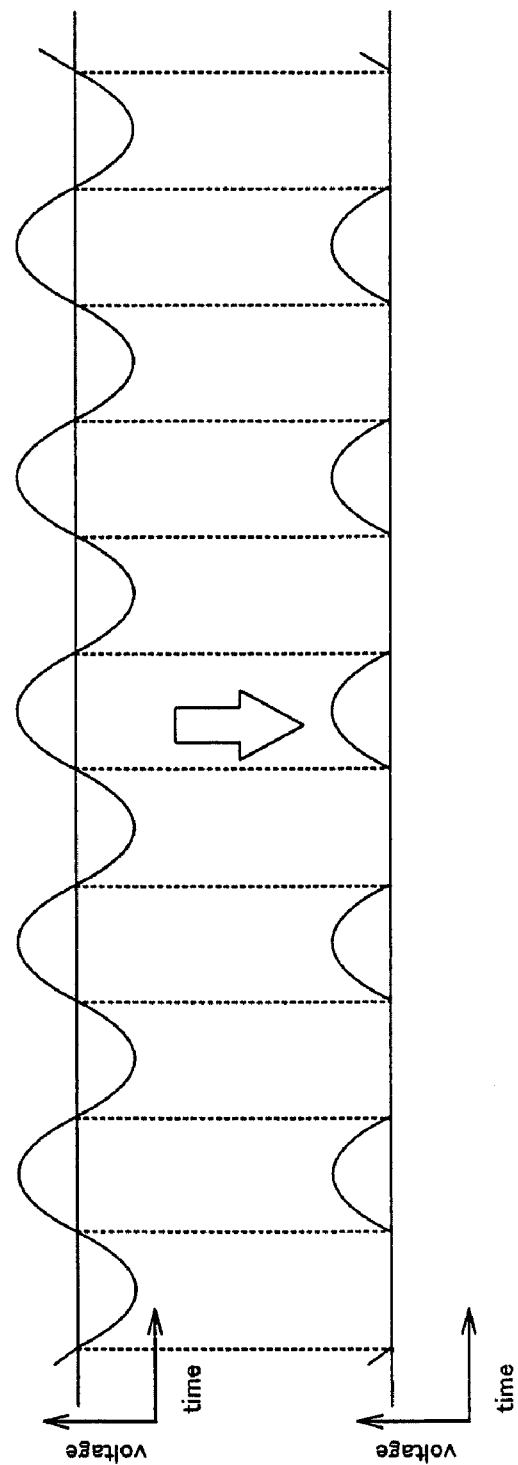
FIGS. 7A and 7B each show how a pulsating signal obtained by rectifying an alternate current changes over time.

FIG. 7A shows how an AC voltage that is not yet rectified by the diode 601 changes over time. Also, FIG. 7B shows how a voltage that has been rectified changes over time. As can be seen by comparing the graph in FIG. 7A with the graph in FIG. 7B, after the rectification, the voltage becomes a so-called pulsating voltage that takes "0" or a value having a polarity on one side each half period.

It is impossible to use the pulsating voltage shown in FIG. 7B as a power supply voltage. Therefore, in usual cases, the pulsating current is flattened and is converted into a DC voltage by accumulating charges in the capacitor. However, if a large-capacity capacitor is formed to make it possible to sufficiently flatten the pulsating current using a thin-film semiconductor, the area of the capacitor itself becomes extremely large. Therefore, this method is unrealistic. In view of this problem, in the present invention, pulsating voltages having different phases are rectified and then synthesized (combined), thereby flattening the voltages. With the structure described above, it becomes possible to sufficiently flatten a pulsating current even if the capacity of the capacitor is small. Further, it becomes possible to sufficiently flatten the pulsating current even if a capacitor is not specially provided.

In FIG. 6, by inputting AC signals, whose phases are different from each other, into four primary coils, four pulsating voltages having different phases are outputted from four diodes 601. Then, the four pulsating voltages described above are combined and a DC power supply voltage, whose height is maintained approximately constant, is generated and outputted to circuits in subsequent stages.

It should be noted here that in FIG. 6, a power supply voltage is generated by combining four pulsating signals having different phases that are outputted from the four diodes 601. However, the present invention is not limited to this structure. That is, the number of phase splits is not limited to this and any other number of phase splits may be used so long as it is possible to flatten the output from the rectifier circuit and use this output as a power supply voltage.

Figure 8A:
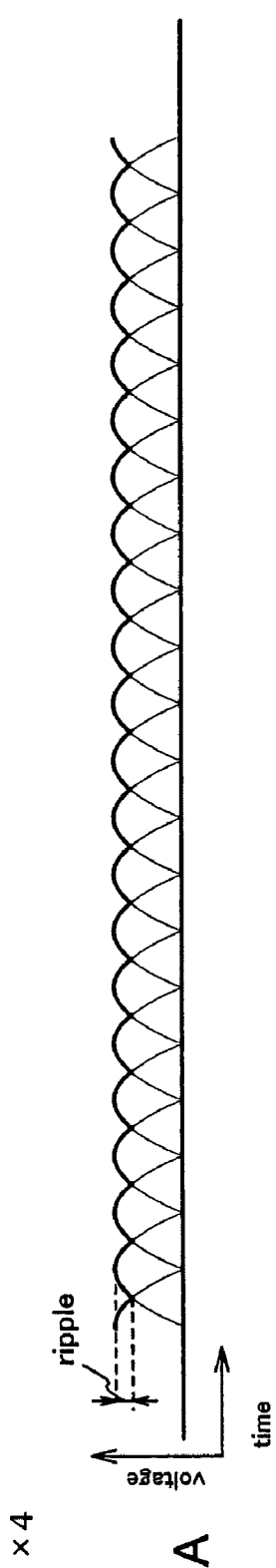
FIGS. 8A to 8C each show how a DC signal generated by combining pulsating currents changes over time.
Figure 8B:
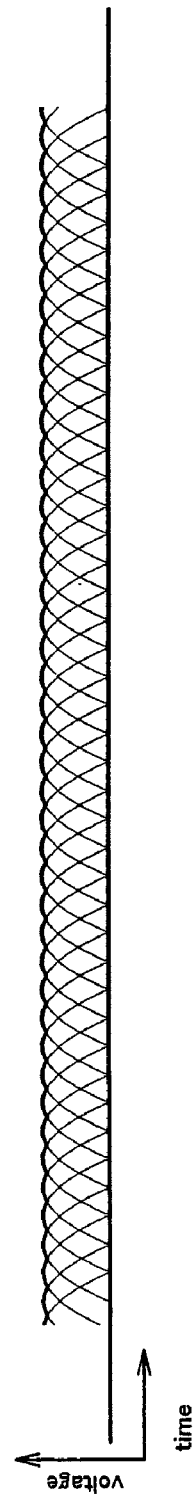

FIGS. 8A and 8B each show how a power supply voltage obtained by combining a plurality of rectified signals changes over time. FIG. 8A shows an example in which one power supply voltage is generated by combining four pulsating voltages having different phases.

It should be noted here that the power supply voltage is generated by combining a plurality of pulsating currents, so that there exists a ripple that is a component other than a direct current. This ripple is the equivalent of a difference between the highest voltage and the lowest voltage of a power supply voltage. The power supply voltage becomes more similar to a direct current in accordance with the reduction of the ripple.

FIG. 8B shows how a power supply voltage obtained by combining eight pulsating voltages having different phases changes over time. It can be seen that the ripple becomes small in comparison with the changing of the power supply voltage over time shown in FIG. 8A.

Figure 8C:
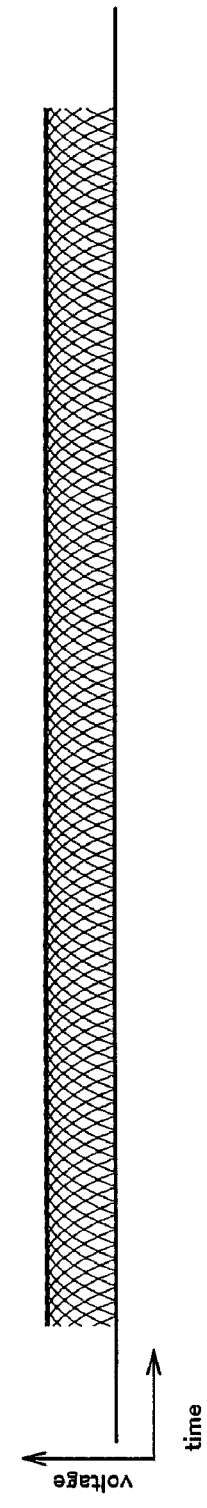

FIG. 8C shows how a power supply voltage obtained by combining 16 pulsating voltages having different phases changes over time. It can be seen that the ripple becomes small in comparison with the changing of the power supply voltage over time shown in FIG. 8B.

As described above, it can be understood that the ripple of a power supply voltage becomes smaller and the voltage becomes more similar to a direct current by combining more pulsating currents whose phases are different from each other. As a result, it becomes easier to flatten a power supply voltage outputted from the rectifier circuit in accordance with the increase of the number of phase splits. Also, it becomes easier to flatten the power supply voltage outputted from the rectifier circuit in accordance with the increase of the capacity of the capacitor 602.

The power supply voltage generated in the rectifier circuit 116b is outputted from the terminals 610 and 611. In more detail, a voltage close to the ground is outputted from the terminal 610 and a power supply voltage having the positive polarity is outputted from the terminal 611. Note that it is possible to reverse the polarity of the outputted power supply voltage by inversely connecting the anode and cathode of the diode. The diode 602 is connected to the terminals 610 and 611 so that the anode and cathode thereof are connected in an inverse manner with respect to the diode 601 connected to the terminals 612 and 613. Accordingly, a voltage close to "0" is outputted from the terminal 612 and a power supply voltage having a negative polarity is outputted from the terminal 613.

It should be noted here that various circuits or circuit elements are formed on the device substrate and the height of a power supply voltage that should be supplied to each circuit or circuit element differs depending on the type or use of the circuit or circuit element. In the rectifier circuit shown in FIG. 6, it is possible to adjust the height of a voltage to be inputted into each terminal by adjusting the amplitude of an inputted AC signal. Further, it is possible to change the heights of power supply voltages to be supplied to circuits or circuit elements by changing the terminals to which the circuits or circuit elements are connected.

The rectifier circuit used in the present invention is not limited to the structure shown in FIG. 6. It does not matter which circuit is used as the rectifier circuit in the present invention so long as the circuit is capable of generating a DC power supply voltage from an inputted AC signal.

In this embodiment mode, there has been described an example in which the device substrate includes the signal line driving circuit and the scanning line driving circuit that are driving circuits. However, the device substrate to be inspected with the present invention is not limited to this. Even in the case where the device substrate has only the pixel unit, it is possible to perform an inspection using the inspection method of the present invention. Also, even in the case of a single element called "TEG" or an evaluation circuit in which single elements are combined, it is possible to inspect defects using the inspection method and the inspection apparatus of the present invention.

Also, in this embodiment mode, there has been described an inspection method for a device substrate of a liquid crystal display, although it is possible to inspect even a semiconductor display device other than the liquid crystal display using the inspection method described in this embodiment mode. Also, the application of the present invention is not limited to a semiconductor display device but it is possible to inspect a semiconductor device using the inspection method of the present invention so long as the semiconductor device uses the characteristics of a semiconductor formed on a substrate. Note that the semiconductor device may be a semiconductor device that uses a semiconductor thin film formed on a glass substrate or be a semiconductor device formed on a single crystalline silicon substrate.

However, it is required to appropriately set the number and design of the primary coils and the number and design of the secondary coils in accordance with the type and specifications of the semiconductor device. It is also required to appropriately set the waveform, frequency, and amplitude of the AC signal for inspection to be inputted into the primary coil forming unit in accordance with the type and specifications of the semiconductor device.

With the present invention, there is obtained the structure described above. As a result, it becomes possible to detect each defective spot without directly setting up probes on wires. This makes it possible to prevent the reduction in yield in the following steps due to minute dust caused by the setting up of the probes. In addition, unlike the optical inspection method, it becomes possible to judge whether all of pattern forming steps have been successfully done or not by a single inspection step. Therefore, the inspection step is more simplified.

EMBODIMENTS

Embodiments of the present invention will be described below.

First Embodiment

In this embodiment, there will be described an example in which an electric field generated in each circuit or circuit element is detected using an electrooptic effect in an inspection step. In more detail, in this embodiment, there will be described an example in which measurements are performed using a Pockels cell.

The Pockels cell is one type of an electrooptic element that uses the Pockels effect that is one electrooptic effect. Note that the electrooptic element is an element that uses an electrooptic effect with which a refractive index is changed by the application of an electric field. By utilizing this property, it becomes possible to use the electrooptic element as a shutter, and to use it to modulate light, and to generate or detect circular polarization by applying an AC voltage or a pulse voltage to a crystal.

Figure 9A:
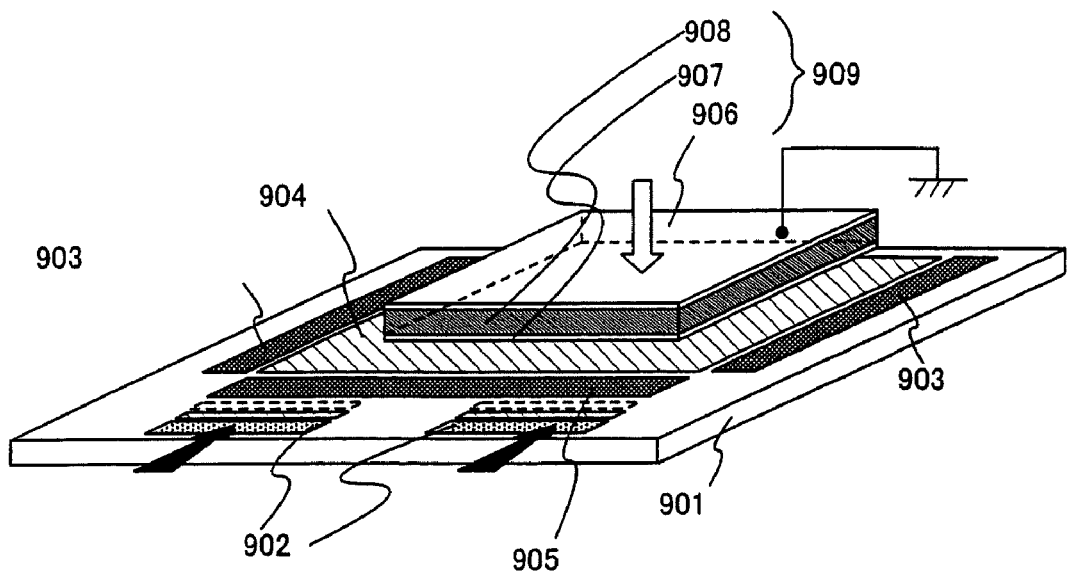
FIGS. 9A and 9B are respectively a perspective view of the device substrate and a Pockels cell during an inspection and a drawing showing a pixel unit viewed through the Pockels cell during the inspection.

FIG. 9A shows a state where a device substrate 901 of a liquid crystal display and a Pockels cell 909 are superimposed on each other.

The device substrate 901 includes secondary coil forming units 902, scanning line driving circuits 903, a pixel unit 904, and a signal line driving circuit 905. Also, a driving signal and power supply voltage for inspection are inputted into each of the scanning line driving circuits 903, the pixel unit 904, and the signal line driving circuit 905 by an AC voltage generated in the secondary coil forming units 902.

The Pockels cell 909 includes a first electrode 906, a second electrode 907, and a Pockels crystal 908 that is a ferroelectric substance crystal. The Pockels crystal 908 is sandwiched between the first electrode 906 and the second electrode 907, with the first electrode 906 and the second electrode 907 being arranged perpendicular to the direction of the optical axis of the Pockels crystal 908.

The first electrode 906 and the second electrode 907 are formed using a conductive material through which light is capable of passing. Indium-tin oxide (ITO) is used in FIG. 9A, although the material of the first electrode and the second electrode of the present invention is not limited to this.

A constant voltage is applied to the first electrode 906. Note that in FIG. 9A, the first electrode 906 is connected to the ground. Also, the first electrode 906 and the second electrode 907 are arranged parallel to the device substrate 901. In addition, the device substrate 901 is arranged on the second electrode 907 side. Note that the second electrode 907 may be arranged so as to contact the device substrate 901 or be arranged so that a certain space is maintained therebetween. Also, a component functioning as a cushion may be sandwiched between the second electrode 907 and the device substrate 901.

Figure 9B:
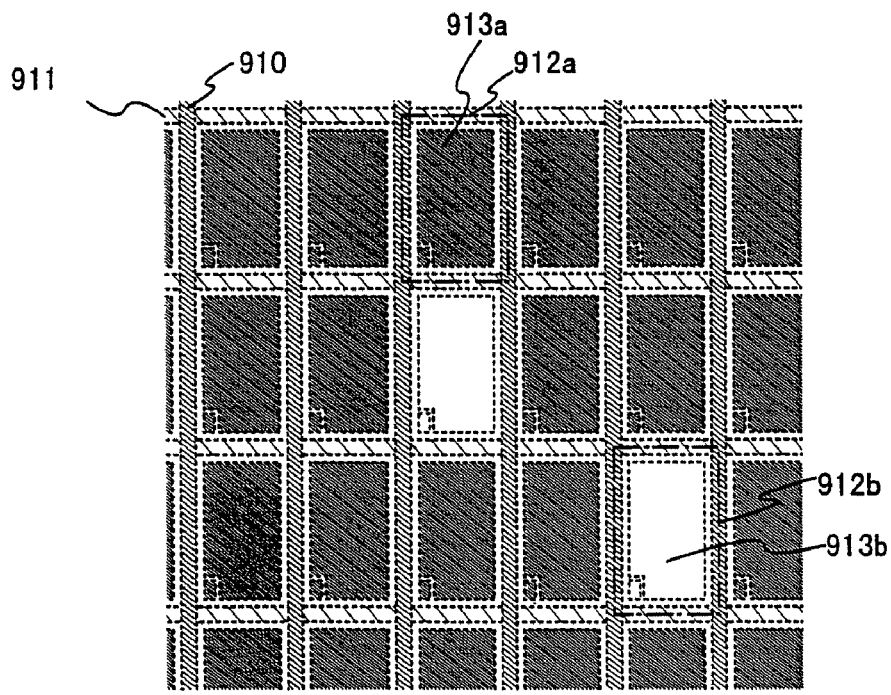

Also, in FIG. 9A, the Pockels cell 909 is arranged so as to be superimposed on the pixel unit 904. FIG. 9B shows a state of the Pockels cell 909 viewed from the arrow direction in FIG. 9A.

A plurality of signal lines 910 and a plurality of scanning lines 911 are formed in the pixel unit 904 and the areas surrounded by the signal lines 910 and the scanning lines 911 are the equivalent of pixels 912. In each pixel 912 (912a and 912b), there is provided a pixel electrode 913 (913a or 913b).

Assuming that among the pixels 912, the pixel 912a is a non-defective and normal pixel and the pixel 912b is a defective pixel, a portion of the Pockels cell 909 superimposed on the pixel electrode 913a differs from a portion superimposed on the pixel electrode 913b in the light transmittance in the arrow direction.

This is because if the device substrate is arranged perpendicular to the optical axis of the ferroelectric substance crystal of the Pockels cell, birefringence is caused in the ferroelectric substance crystal due to the electric field generated in the circuit or circuit element.

The refractive index of this birefringence exhibited for deflection having an electric field direction component is determined by the strength of an electric field. Consequently, in a plurality of circuits or circuit elements that have the same structure and operate normally, there occur electric fields having the same strength. As a result, in portions, in which the ferroelectric substance crystal is superimposed on each circuit or circuit element, the refractive index of the ferroelectric substance crystal becomes approximately the same.

However, an electric field generated in a defective circuit or circuit element may be stronger or weaker than an electric field generated in another normal circuit or circuit element. Accordingly, the refractive index of each portion of the ferroelectric substance crystal that is superimposed on a defective circuit or circuit element differs from the refractive index of each portion of the ferroelectric substance crystal that is superimposed on another normal circuit or circuit element. As a result, when the device substrate is viewed through the Pockels cell, each portion that is superimposed on a defective circuit or circuit element looks brighter or darker than each portion that is superimposed on a normal circuit or circuit element.

As a result, it becomes possible to calculate transmittance of the Pockels cell and detect each defective spot by separating light in each pixel traveling in a direction perpendicular to the device substrate using an optical system such as a polarizing beam splitter and by monitoring the strength of the separated light. In FIG. 9B, it can be seen that a defect occurs in the pixel 912b. Note that the detection of each defective spot may be performed by carrying out calculation processing of some kind for results obtained by a plurality of monitoring operations.

Also, the presence or absence of defects may be judged or defective spots themselves may be identified by inputting the outputs from all circuits that are inspection targets into the inspection dedicated circuit and measuring the strength of an electric field generated in the inspection dedicated circuit using an electrooptic device. By using the inspection dedicated circuit, it becomes unnecessary to monitor each circuit or circuit element that is an inspection target using the Pockels cell. As a result, it becomes possible to simplify the inspection step and to perform the inspection step swiftly.

It should be noted here that in this embodiment, there has been described an example in which each defect of the pixel unit 904 is detected, although this embodiment is not limited to this. It is possible to detect each defective spot in a like manner by superimposing the Pockels cell 909 on the scanning line driving circuits 903 and the signal line driving circuit 905 and by monitoring a refractive index. It is also possible to similarly detect defects, such as wire breaking and short circuits, occurring in the leading wires on the device substrate.

It should be noted here that a crystal, such as $NH_4H_2PO_4$, $BaTiO_3$, $KH_2PO_4$ (KHP), $KD_2PO_4$ (KDP), $LiNbO_3$, ZnO, is be mainly used as the Pockels crystal. However, the Pockels crystal that can be used in this embodiment is not limited to the crystals described above. That is, any other crystal may be used so long as the crystal has the Pockels effect.

Also, the Pockels cell is used in this embodiment, although the electrooptic device for sensing the strength of an electric field is not limited to this. That is, it is possible to use any other electrooptic device for the inspection method or inspection apparatus of the present invention so long as the electrooptic device uses a phenomenon where its optical properties is changed by the application of a voltage. Consequently, it is possible to use a liquid crystal or the like.

Second Embodiment

In this embodiment, the driving signal and power supply voltage for inspection will be described in more detail by taking, as examples, cases of a liquid crystal display and an OLED display.

The number of the primary coils and the number of the secondary coils are changed in accordance with the structures of the pixel unit and the driving circuit of the device substrate, so that it is important to set these numbers in accordance with the specifications of each device substrate.

Figure 10:
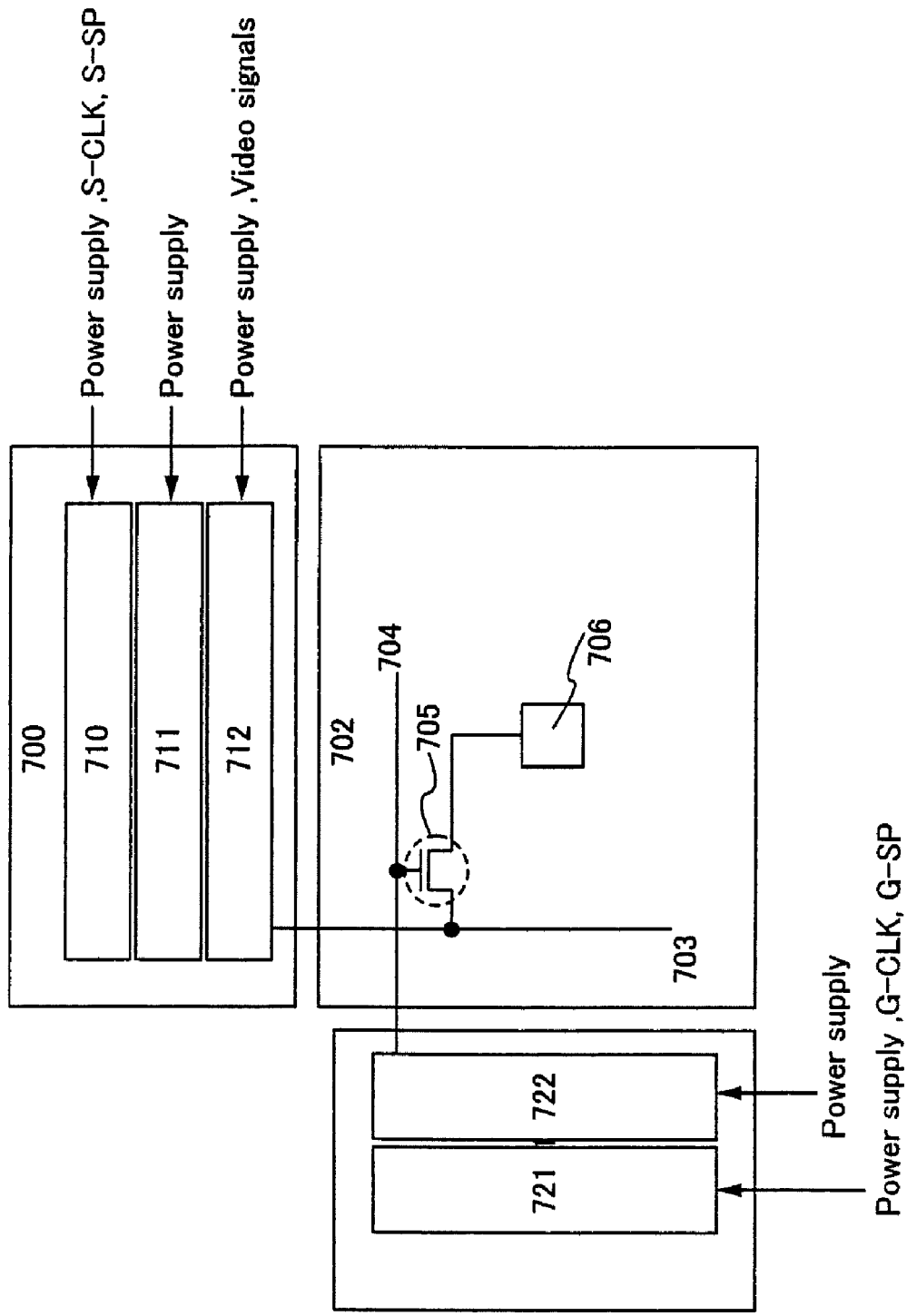
FIG. 10 is a block diagram of a device substrate of a liquid crystal display.

FIG. 10 shows the structure of a device substrate of a general liquid crystal display. The device substrate shown in FIG. 10 includes a signal line driving circuit 700, a scanning line driving circuit 701, and a pixel unit 702.

A plurality of signal lines and a plurality of scanning lines are formed in the pixel unit 702 and the areas surrounded by the signal lines and the scanning lines are the equivalent of pixels. Note that in FIG. 10, among a plurality of pixels, only a pixel having one signal line 703 and one scanning line 704 is shown as a representative example. Each pixel includes a pixel TFT functioning as a switching element and a pixel electrode 706 of a liquid crystal cell.

A gate electrode of the pixel TFT 705 is connected to the scanning line 704. Also, the source region and the drain region of the pixel TFT 705 are connected to the signal line 703 and the pixel electrode 706, respectively.

The signal line driving circuit 700 includes a shift register 710, a level shifter 711, and an analog switch 712. A power supply voltage (Power supply) is given to the shift register 710, the level shifter 711, and the analog switch 712. Also, a clock signal (S-CLK) and a start pulse signal (S-SP) for a signal line driving circuit are given to the shift register 710. Further, a video signal (Video signals) is given to the analog switch 712.

When a clock signal (S-CLK) and a start pulse signal (S-SP) are inputted into the shift register 710, a sampling signal that determines the timings for sampling the video signal is generated and inputted into the level shifter 711. As to the sampling signal, the amplitude of its voltage is increased in the level shifter 711. Then, the sampling signal is inputted into the analog switch 712. In the analog switch 712, the inputted video signal is sampled in synchronization with the inputted sampling signal and is inputted into the signal line 703.

On the other hand, the scanning line driving circuit includes a shift register 721 and a buffer 722. A power supply voltage (Power supply) is given to the shift register 721 and the buffer 722. Also, a clock signal (G-CLK) and a start pulse signal (G-SP) for the scanning line driving circuit are given to the shift register 721.

When the clock signal (G-CLK) and the start pulse signal (G-SP) are inputted into the shift register 721, a selection signal that determines the timings for selecting the scanning lines is generated and inputted into the buffer 722. The selection signal inputted into the buffer 722 is buffer-amplified and is inputted into the scanning line 704.

When the scanning line 704 is selected, the pixel TFT 705, whose gate electrode is connected to the selected scanning line 704, is turned on. Then, the video signal that has been sampled and inputted into the signal line is inputted into the pixel electrode 706 via the turned-on pixel TFT 705.

When the signal line driving circuit 700, the scanning line driving circuit 701, and the pixel unit 702 operate in this manner, an electric field or an electromagnetic wave is generated in each circuit or circuit element. By monitoring this electric field or electromagnetic wave using a means of some kind, it becomes possible to detect each defective spot.

In the case of the device substrate shown in FIG. 10, the S-CLK, S-SP, G-CLK, G-SP, and video signal are inputted into each circuit as driving signals for inspection. Note that the driving signals for inspection are not limited to the signals described above. It is possible to use any other signals as the driving signals for inspection so long as the signals relate to driving. For instance, aside from the signals described above, there may be inputted a signal that determines the timings for switching scanning directions of the scanning lines, a signal that switches the direction in which the selection signal is inputted into the scanning lines, or the like. However, it is important to input a signal, with which it is possible to detect the presence or absence of defects in circuits or circuit elements, into a circuit for which an inspection should be performed.

Also, in the case where not all of circuits of a device substrate but some out of the circuits should be subjected to an inspection, if it is possible to detect defective portions of the circuits, it is not required to input all of the driving signals described above. For instance, if only the shift register 710 of the signal line driving circuit 700 should be subjected to an inspection, it is enough that only the S-CLK and S-SP that are driving signals for inspection and a power supply voltage for inspecting the shift register 710 are generated in the waveform shaping circuit and the rectifier circuit and are inputted into the shift register 710.

Figure 11:
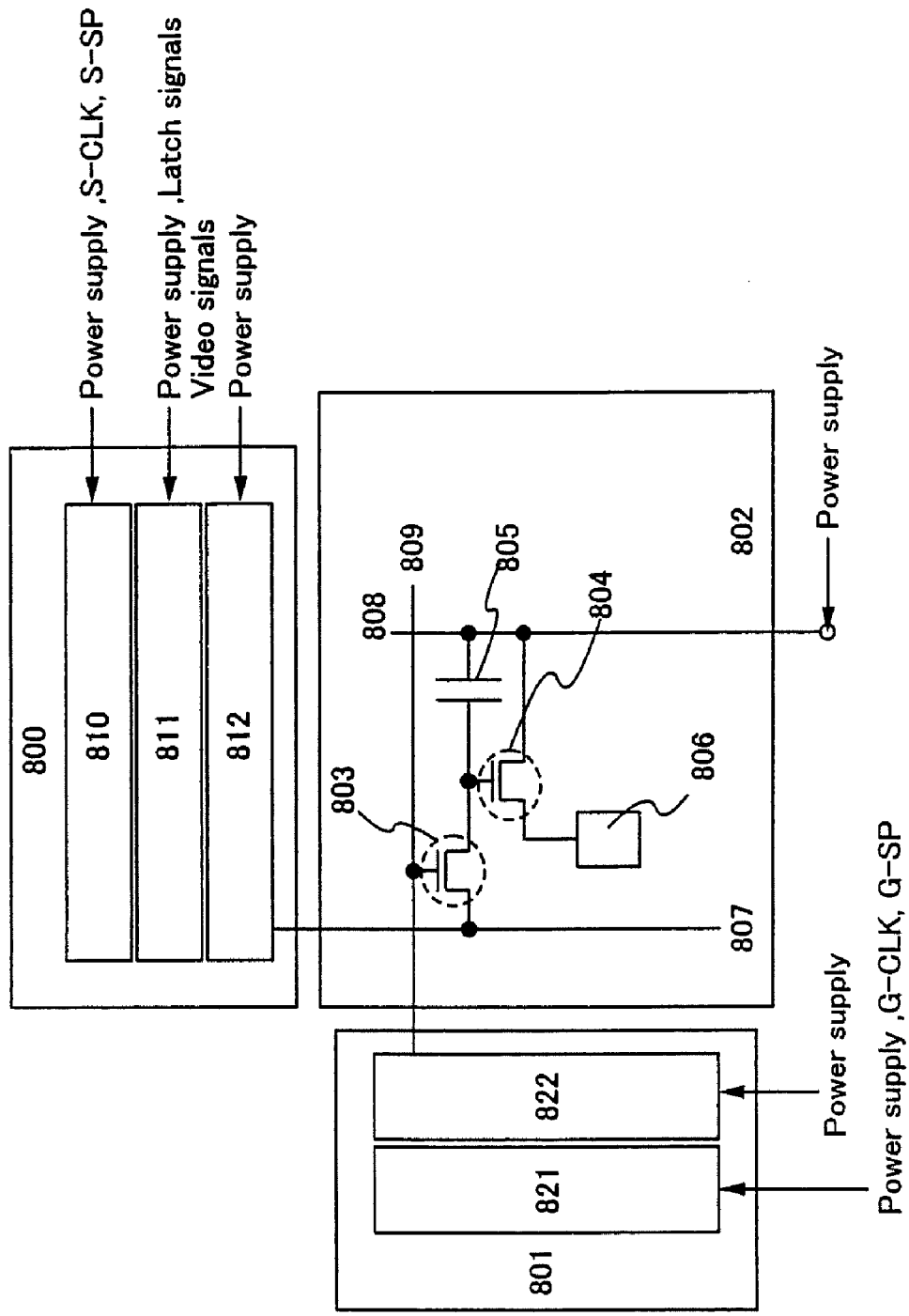
FIG. 11 is a block diagram of a device substrate of an OLED display.

Next, the structure of the device substrate of a general OLED display is shown in FIG. 11. Note that FIG. 11 illustrates, as an example, a driving circuit of an OLED display that displays an image using digital video signals. The device substrate shown in FIG. 11 includes a signal line driving circuit 800, a scanning line driving circuit 801, and a pixel unit 802.

A plurality of signal lines, a plurality of scanning lines, and a plurality of power supply lines are formed in the pixel unit 802 and the areas surrounded by the signal lines, the scanning lines, and the power supply lines are the equivalent of pixels. Note that in FIG. 11, among a plurality of pixels, only a pixel having one signal line 807, one scanning line 809, and one power supply line 808 is shown as a representative example. Each pixel includes a switching TFT 803 functioning as a switching element, a driving TFT 804, a holding capacitor 805, and a pixel electrode 806 of the OLED.

The gate electrode of the switching TFT 803 is connected to the scanning line 809 and has the source region and the drain region, one of which is connected to the signal line 807 and the other one of which is connected to the gate electrode of the driving TFT 804.

The driving TFT 804 has the source region and the drain region, one of which is connected to the power supply line 808 and the other one of which is connected to the pixel electrode 806. Also, the holding capacitor 805 is formed by the gate electrode of the driving TFT 804 and the power supply line 808. Note that it is not necessarily required to form the holding capacitor 805.

The signal line driving circuit 800 includes a shift register 810, a first latch 811, and a second latch 812. A power supply voltage (Power supply) is given to each of the shift register 810, the first latch 811, and the second latch 812. Also, a clock signal (S-CLK) and a start pulse signal (S-SP) for the signal line driving circuit are given to the shift register 810. Further, a latch signal (Latch signals) that determines the timings for latching and a video signal (Video signals) are given to the first latch 811.

When the clock signal (S-CLK) and the start pulse signal (S-SP) are inputted into the shift register 810, a sampling signal that determines the timings for sampling the video signal is generated and inputted into the first latch 811.

It should be noted here that the sampling signal from the shift register 810 may be inputted into the first latch 811 after being buffer-amplified by a buffer or the like. A wire into which the sampling signal is inputted has a large load capacity (parasitic capacitance) because many circuits or circuit elements are connected to this wire. This buffer is effective at preventing a situation where the leading edge and trailing edge of the timing signal is "slowly moving" due to this large load capacity.

The first latch 811 includes latches in a plurality of stages. In this first latch 811, an inputted video signal is sampled and is stored in the latch in each stage in succession in synchronization with an inputted sampling signal.

A period of time taken to complete the writing of the video signal into the latch in each stage of the first latch 811 is called a "line period". In actual cases, the line period may include a horizontal blanking period.

When one line period is finished, a latch signal is inputted into the second latch 812. At this instant, the video signal written into the first latch 811 and is held therein is simultaneously sent to the second latch 812, in which the video signal is written into the latch in each stage of the second latch 812 and is held therein.

When the video signal has been sent from the first latch 811 to the second latch 812, the writing of a video signal into the first latch 811 is performed in succession on the basis of the sampling signal from the shift register 810.

In this second one line period, the video signal written into the second latch 812 and is held therein is inputted into a source signal line.

On the other hand, the scanning line driving circuit includes a shift register 821 and a buffer 822. A power supply voltage (Power supply) is given to the shift register 821 and the buffer 822. Also, a clock signal (G-CLK) and a start pulse signal (G-SP) for the scanning line driving circuit are given to the shift register 821.

When the clock signal (G-CLK) and the start pulse signal (G-SP) are inputted into the shift register 821, a selection signal that determines the timings for selecting the scanning lines is generated and inputted into the buffer 822. The selection signal inputted into the buffer 822 is buffer-amplified and inputted into the scanning line 809.

When the scanning line 809 is selected, the switching TFT 803, whose gate electrode is connected to the selected scanning line 809, is turned on. Then, the video signal inputted into the signal line is inputted into the gate electrode of the driving TFT 804 via the turned-on switching TFT 803.

The switching of the driving TFT 804 is controlled on the basis of the information "1" or "0" contained in the video signal inputted into the gate electrode. When the driving TFT 804 is turned on, the potential of the power supply line is given to the pixel electrode. When the driving TFT 804 is turned off, the potential of the power supply line is not given to the pixel electrode.

When the signal line driving circuit 800, the scanning line driving circuit 801, and the pixel unit 802 operate in this manner, an electric field or an electromagnetic wave is generated in each circuit or circuit element. By monitoring this electric field or electromagnetic wave using a means of some kind, it becomes possible to detect each defective spot.

In the case of the device substrate shown in FIG. 11, the S-CLK, S-SP, G-CLK, G-SP, a latch signal, and a video signal are inputted into each circuit as driving signals for inspection. Note that the driving signals for inspection are not limited to the signals described above. It is possible to use any other signals as the driving signals for inspection so long as the signals relate to driving. For instance, aside from the signals described above, there may be inputted a signal that determines the timings for switching the scanning directions of the scanning lines, a signal that switches the direction in which a selection signal is inputted into the scanning lines, or the like. However, it is important to input a signal with which it is possible to detect the presence or absence of defects in circuits or circuit elements in a circuit for which an inspection should be performed.

Also, in the case where not all of circuits of a device substrate but some of the circuits are regarded as inspection targets, if it is possible to detect defective portions of the circuits, it is not required to input all of the driving signals described above. For instance, if only the shift register 810 of the signal line driving circuit 800 should be subjected to an inspection, it is enough that only the S-CLK and S-SP that are driving signals for inspection and a power supply voltage for inspecting the shift register 810 are generated in the waveform shaping circuit and the rectifier circuit and are inputted into the shift register 810.

It should be noted here that in the case where a power supply voltage is generated by combining a plurality of pulsating signals having different phases, the number of the primary coils is also affected by the number of the combined pulsating signals.

It should be noted here that the scope of application of the inspection apparatus and the inspection method of the present invention is not limited to the device substrates having the structures shown in FIGS. 10 and 11. It is possible to apply the inspection apparatus and the inspection method of the present invention to any semiconductor devices regardless of their types and specifications so long as an electromagnetic wave or an electric field is generated in each circuit or circuit element in the semiconductor devices by inputting a driving signal and a power supply voltage in a non-contact manner.

It is possible to carry out this embodiment by freely combining this embodiment with the first embodiment.

Third Embodiment

In this embodiment, there will be described a line for cutting a substrate after an inspection is finished.

Figure 12:
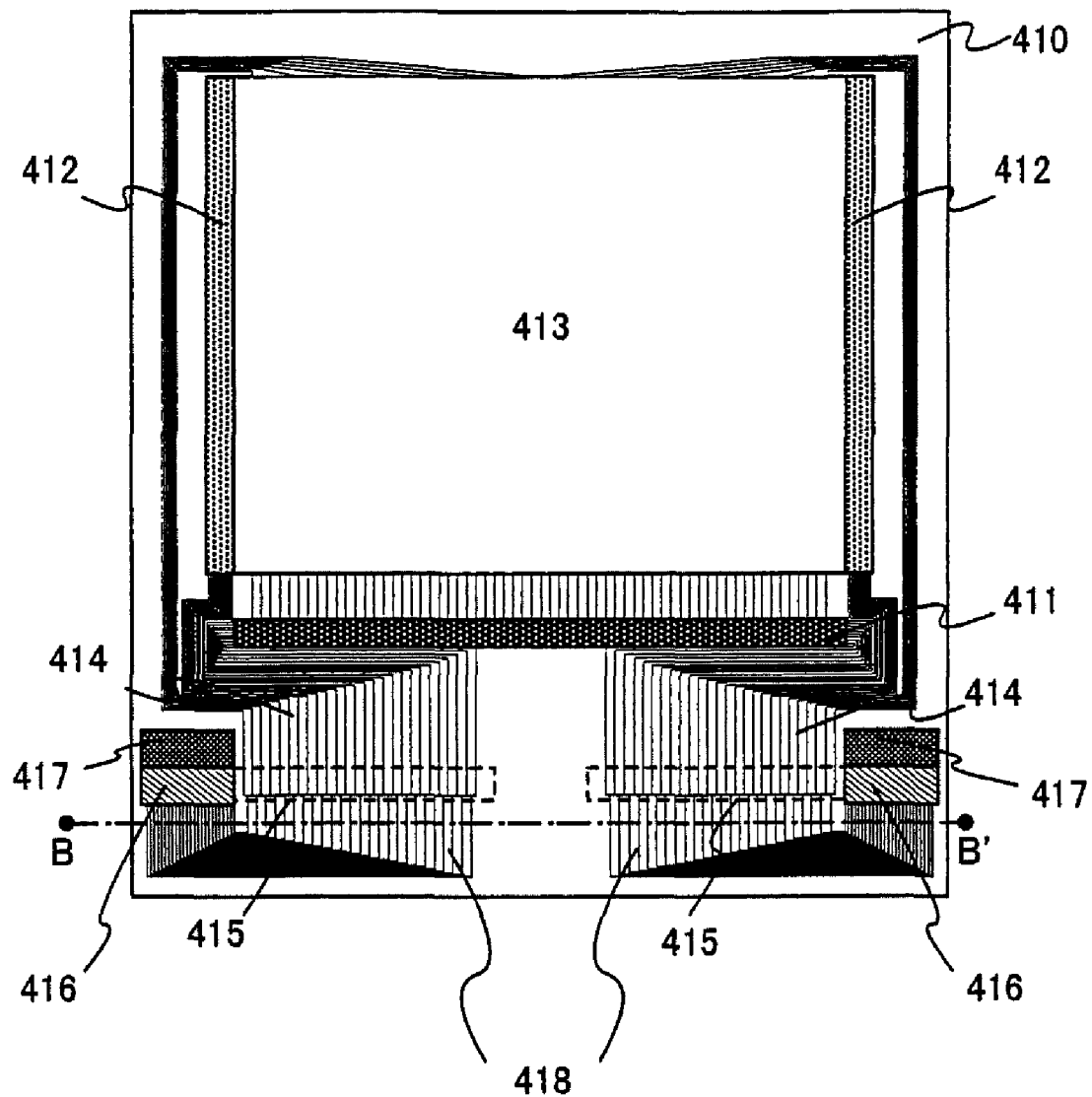
FIG. 12 is a top view of a device substrate.

FIG. 12 is a top view of a device substrate to be inspected with the inspection method of the present invention. Note that in this embodiment, the inspection method of the present invention will be described by taking, as an example, a device substrate of a liquid crystal display. However, the use of the inspection method of the present invention is not limited to a liquid crystal display but may be used for any other semiconductor devices so long as the semiconductor devices are formed using semiconductors.

As to the device substrate shown in FIG. 12, a signal line driving circuit 411, scanning line driving circuits 412, a pixel unit 413, leading wires 414, connector connecting units 415, waveform shaping circuits or rectifier circuits 416, secondary coil forming units 417, and coil wires 418 are provided on a substrate 410. Note that in this specification, the device substrate includes the substrate 410 and all circuits or circuit elements formed on the substrate 410.

An FPC, a TAB, or the like is connected to each connector connecting unit 415 in a step following the inspection step.

After the inspection step is finished, the device substrate is cut along the dotted line B-B' so that the leading wires 414 and the coil wires 418 are physically and electrically separated from each other. Note that in this embodiment, after a portion of the device substrate is cut off, each secondary coil forming unit 417 is left on the substrate that will be used to structure a semiconductor device. The secondary coil forming unit 417 and the leading wires 414 are electrically and physically separated from each other, so that even if the secondary coil forming unit 417 is left on the substrate, this secondary coil forming unit 417 does not interfere with the operation of the finished semiconductor device.

It should be noted here that it is not necessarily required to separate the coil wires 418 at the same time as the cutting of the substrate. For instance, the coil wires 418 may be electrically separated using a laser or the like. As to the cutting of the coil wires 418, it is enough that the secondary coil forming units 417 and the circuits or circuit elements of the device substrate are electrically separated from each other.

It should be noted here that the waveform shaping circuits or rectifier circuits 416 may also be left on the substrate that will be used to structure the semiconductor device after the cutting or be formed on a substrate that will be not used to structure the semiconductor device.

It is possible to carry out this embodiment by freely combining the structure of this embodiment with the structure in the first or second embodiment.

Fourth Embodiment

In this embodiment, there will be described the cutting of a substrate after an inspection is finished in the case where a plurality of substrates for display are formed using a large device substrate.

Figure 13:
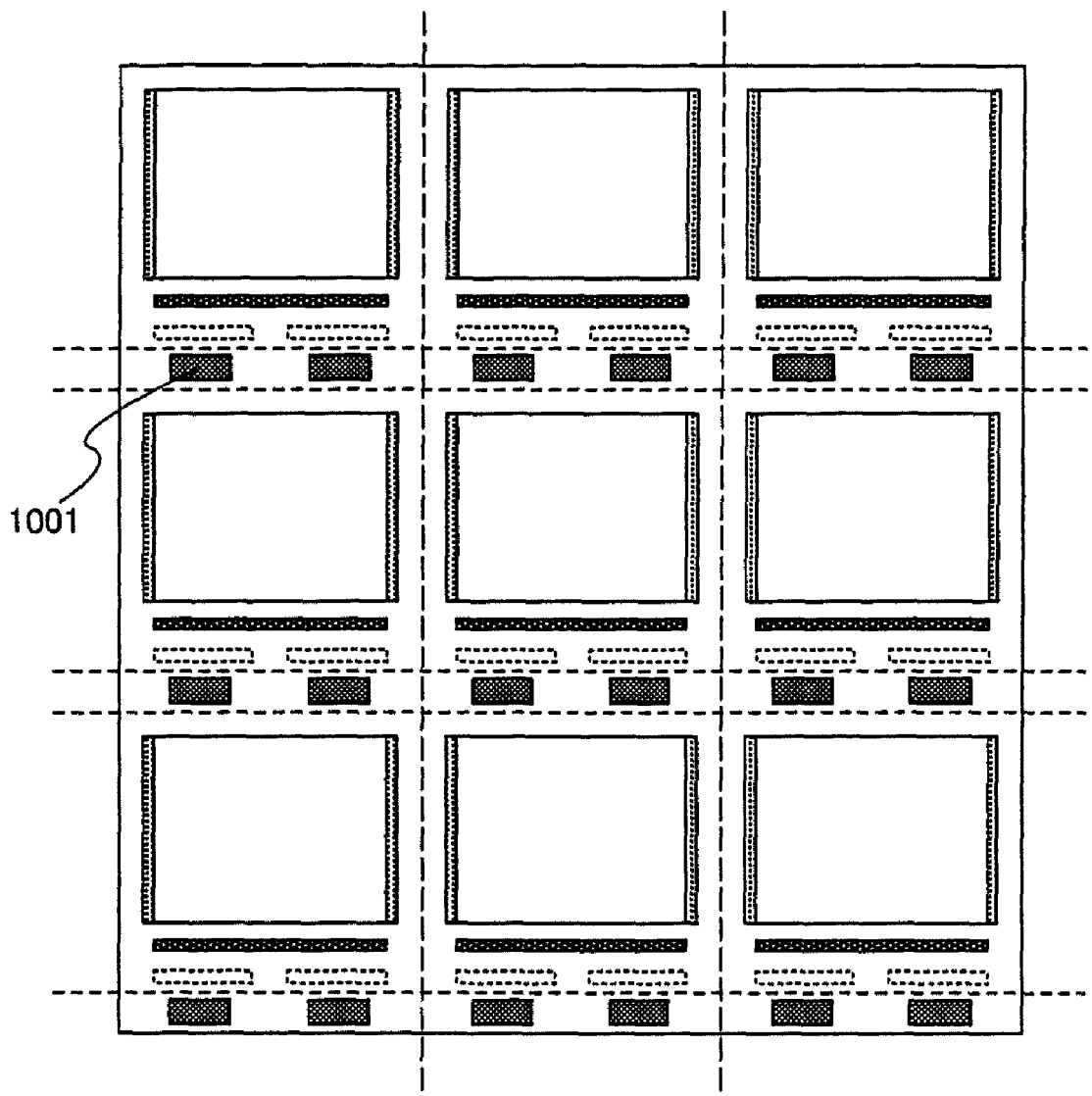
FIG. 13 is a top view of a large device substrate.

FIG. 13 is a top view of the large device substrate of this embodiment that is not yet cut. In FIG. 13, by cutting the device substrate along the dotted lines, nine substrates for display are formed from a single device substrate. Note that in this embodiment, there is shown an example in which nine substrates for display are formed from a single substrate, although this embodiment is not limited to this number.

It should be noted here that during the cutting, leading wires and coil wires are cut and destroyed so that these wires are physically and electrically separated from each other. Also, in FIG. 13, after the cutting of the device substrate, there is obtained a situation where each secondary coil forming unit 1001 is provided on a substrate that will not be used for display.

Figure 14:
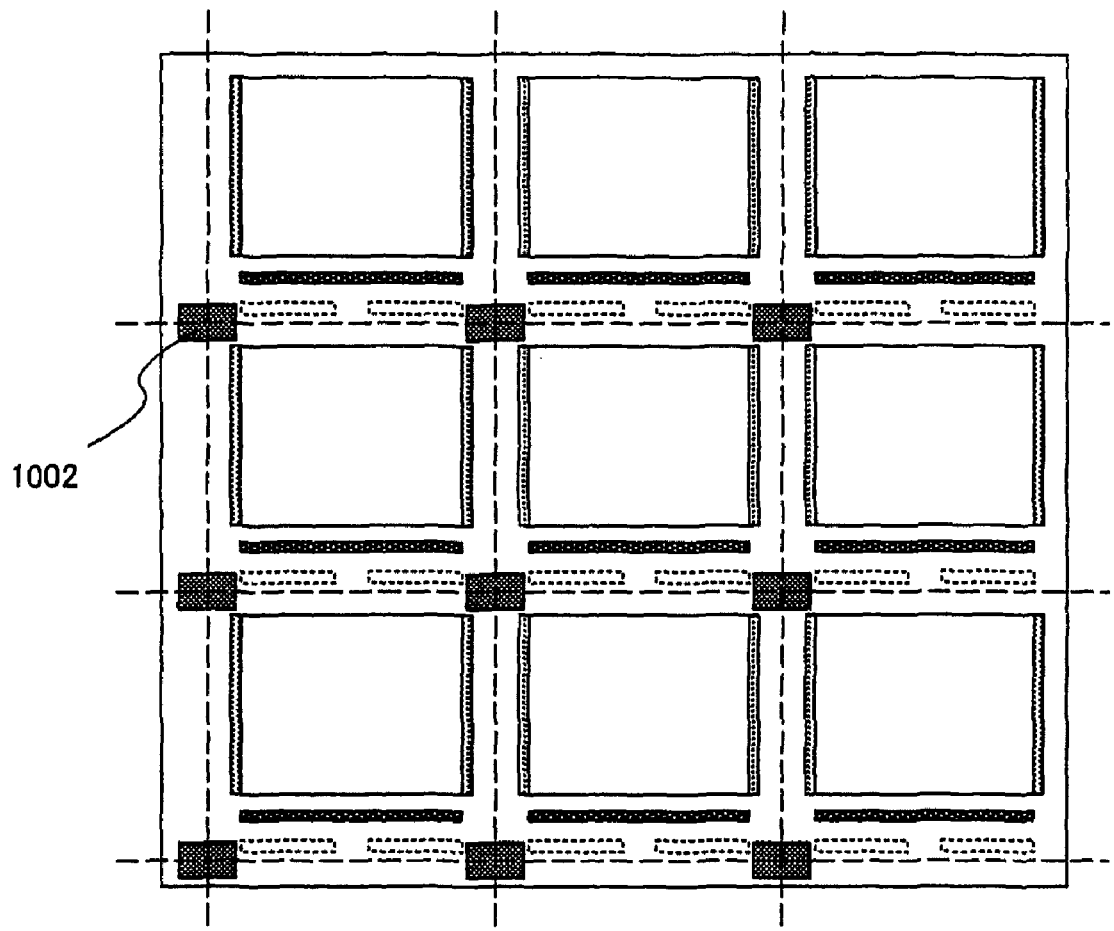
FIG. 14 is a top view of another large device substrate.

As to a manner in which the large substrate is cut, an example that is different from the example shown in FIG. 13 will be described. FIG. 14 is a top view of another large device substrate of this embodiment that is not yet cut. In FIG. 14, by cutting the device substrate along the dotted lines, nine substrates for display are formed from a single device substrate. Note that in this embodiment, there is shown an example in which nine substrates for display are formed from a single device substrate, although this embodiment is not limited to this number.

It should be noted here that during the cutting, leading wires and coil wires are cut and destroyed so that these wires are physically and electrically separated from each other. Also, in FIG. 14, each secondary coil forming unit 1002 is provided on a line for cutting the substrate and is cut and destroyed after the inspection is finished. After the inspection is finished, the secondary coil forming unit 1002 becomes unnecessary, so that the secondary coil forming unit 1002 does not interfere with the operation of a finished semiconductor device.

It should be noted here that the waveform shaping circuit or rectifier circuit may be left on the substrate that will be used to structure a semiconductor device after the cutting or be formed on a substrate that will not be used to structure a semiconductor device. Also, the waveform shaping circuit or rectifier circuit may be destroyed after the cutting.

It is possible to carry out this embodiment by freely combining the structure of this embodiment with the structures of the first to third embodiments.

Fifth Embodiment

In this embodiment, the flow of the inspection step of the present invention will be described with reference to a flowchart.

Figure 15:
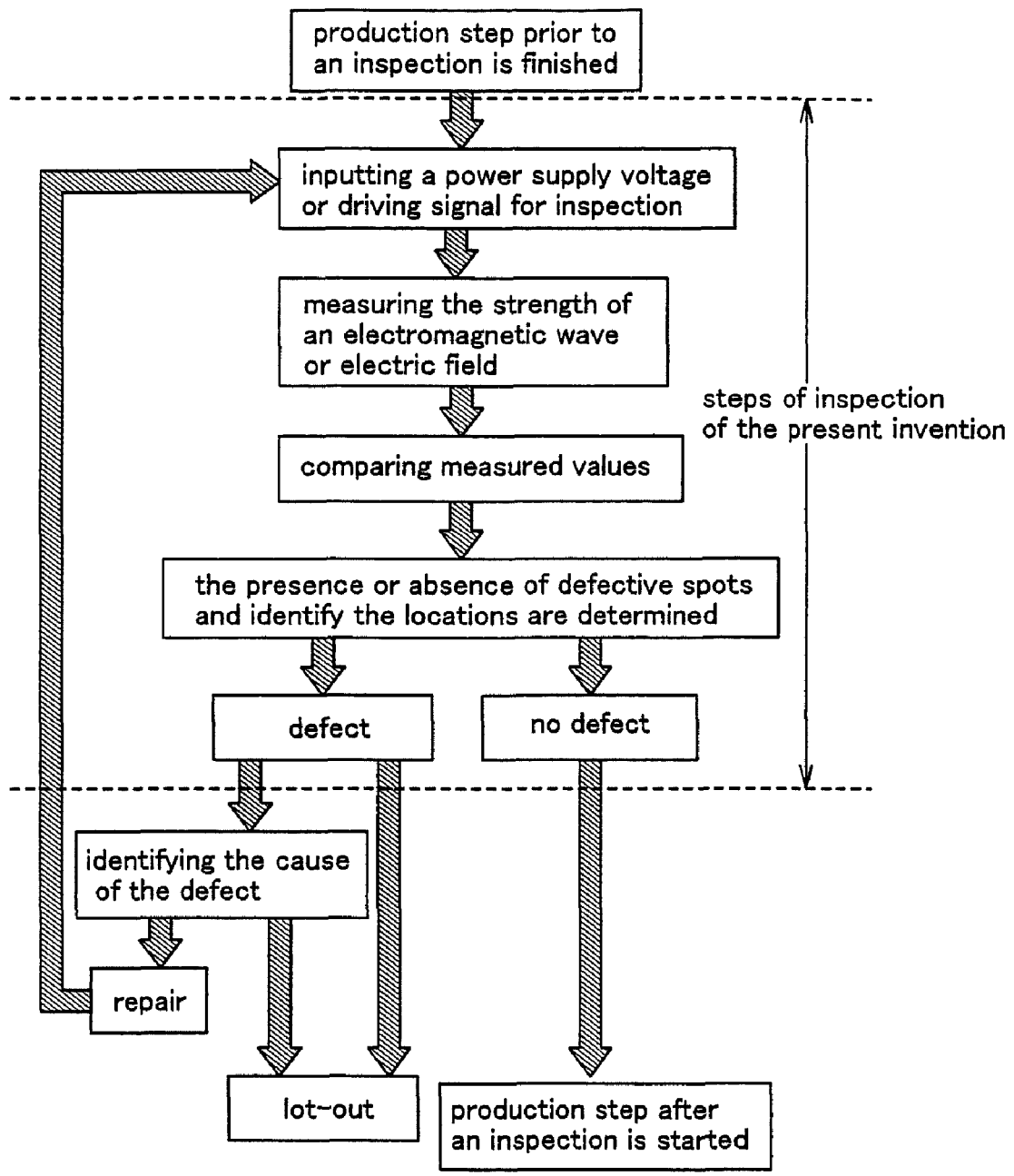
FIG. 15 is a flowchart showing the flow of an inspection step of the present invention.

FIG. 15 is a flowchart of the inspection step of the present invention. First, after a production step prior to an inspection is finished, a power supply voltage or driving signal for inspection is inputted into circuits or circuit elements of the device substrate.

Then, under a state where the power supply voltage or driving signal for inspection is being inputted into the device substrate, the strength of an electromagnetic wave or electric field generated in each circuit or circuit element of the device substrate that is an inspection target is monitored using a publicly known measuring method.

Then, the strength of the generated electromagnetic wave or electric field is compared with that generated in a circuit element that operates normally. Note that during this process, a measured value of a circuit or circuit element may be compared with a measured value of another circuit or circuit element. Alternatively, a value obtained from a theoretical value calculated by performing a simulation may be compared with a measured value.

Then, it is judged that each circuit or circuit element, in which there is generated an electromagnetic wave or electric field whose strength has been judged as greatly differing from a reference value as a result of this comparison, as a defective spot. Accordingly, it becomes possible to simultaneously determine the presence or absence of defective spots and identify the locations thereof. Note that it is possible for a person who carries out the present invention to appropriately set the criteria for judging the strength of an electromagnetic wave or electric field generated in each defective spot during this process.

If there exist no defects, it is judged that the inspection is finished at this point in time and a manufacturing step following the inspection step is started.

If there exists any defect, there is selected one out of (1) a step for terminating the attempt to finish the substrate as a product by dropping the substrate from the manufacturing steps (lot-out) or (2) a step for identifying the cause of the defect. Note that in the case where a plurality of products are to be produced from a single large substrate, the lot-out is performed after the cutting of the substrate.

In the case where the cause of the defect is identified and it is judged that the repair of the defect is possible, it is possible that the inspection step of the present invention is performed again after the repair and the processes described are repeated. Conversely, if it is judged that the repair is impossible, the lot-out is performed at this point in time.

It is possible to carry out this embodiment by freely combining the structure of this embodiment with the structures of the first to fourth embodiments.

Sixth Embodiment

In this embodiment, how a coil used in the present invention is connected to terminals and wire (coil wire) of the coil will be described in detail.

Figure 16A:
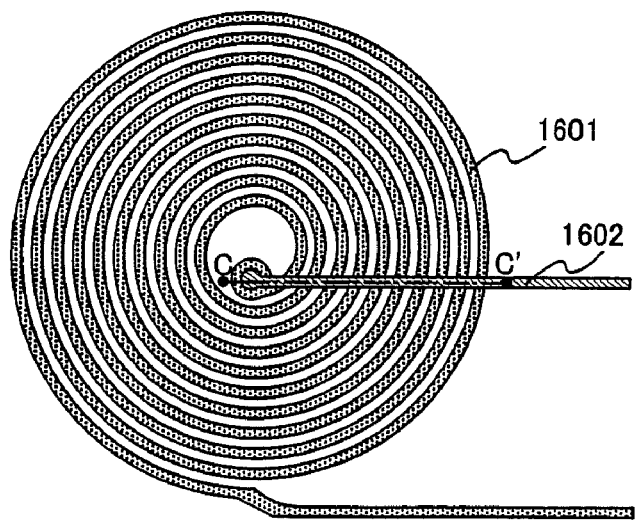
FIGS. 16A to 16D are each a top view or a cross-sectional view of a coil.

In FIG. 16A, a coil 1601 is formed on an insulating surface and an interlayer insulating film 1603 is formed on this insulating surface so as to cover the coil 1601. Also, a contact hole is formed in the interlayer insulating film and a coil wire 1602 is formed on the interlayer insulating film so as to be connected to the coil 1601 through the contact hole.

Figure 16B:
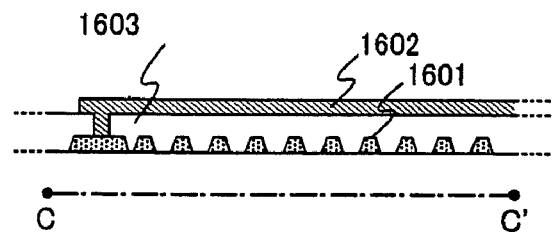

FIG. 16B is a cross-sectional view taken along the broken line C-C' in FIG. 16A.

Figure 16C:
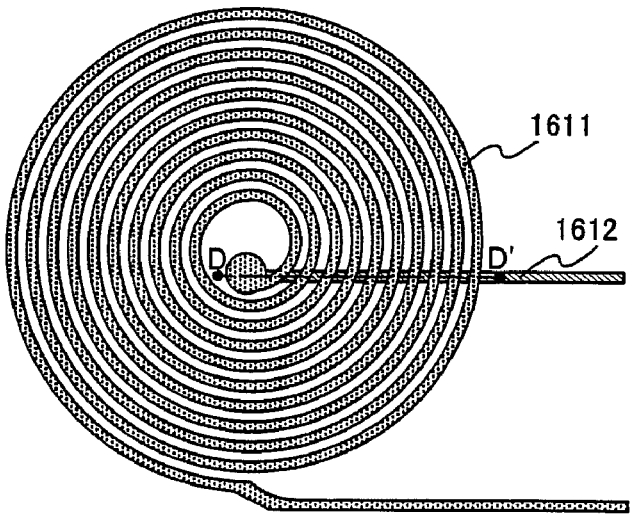

In FIG. 16C, a coil wire 1612 is formed on an insulating surface and an interlayer insulating film 1613 is formed on the insulating surface so as to cover the coil wire 1612. Also, a contact hole is formed in the interlayer insulating film and a coil 1611 is formed on the interlayer insulating film so as to be connected to the coil wire 1612 through the contact hole.

Figure 16D:
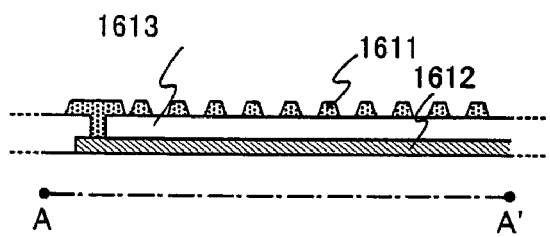

FIG. 16D is a cross-sectional view taken along the broken line D-D' in FIG. 16C.

It should be noted here that the method of manufacturing a coil used in the present invention is not limited to the method described above. A spiral groove is formed by patterning an insulating film and a conductive film is formed on the insulating film so as to cover the groove. Following this, a structure where the conductive film remains only in the groove is obtained by grinding the conductive film through etching or using a CMP method until the insulating film is exposed. It is possible to use this conductive film remaining in the groove as a coil.

It is possible to carry out this embodiment by freely combining the structure of this embodiment with the structures of the first to fifth embodiments.

Seventh Embodiment

In this embodiment, there will be described a structure of an inspection apparatus for performing an inspection using the inspection method of the present invention.

Figure 17:
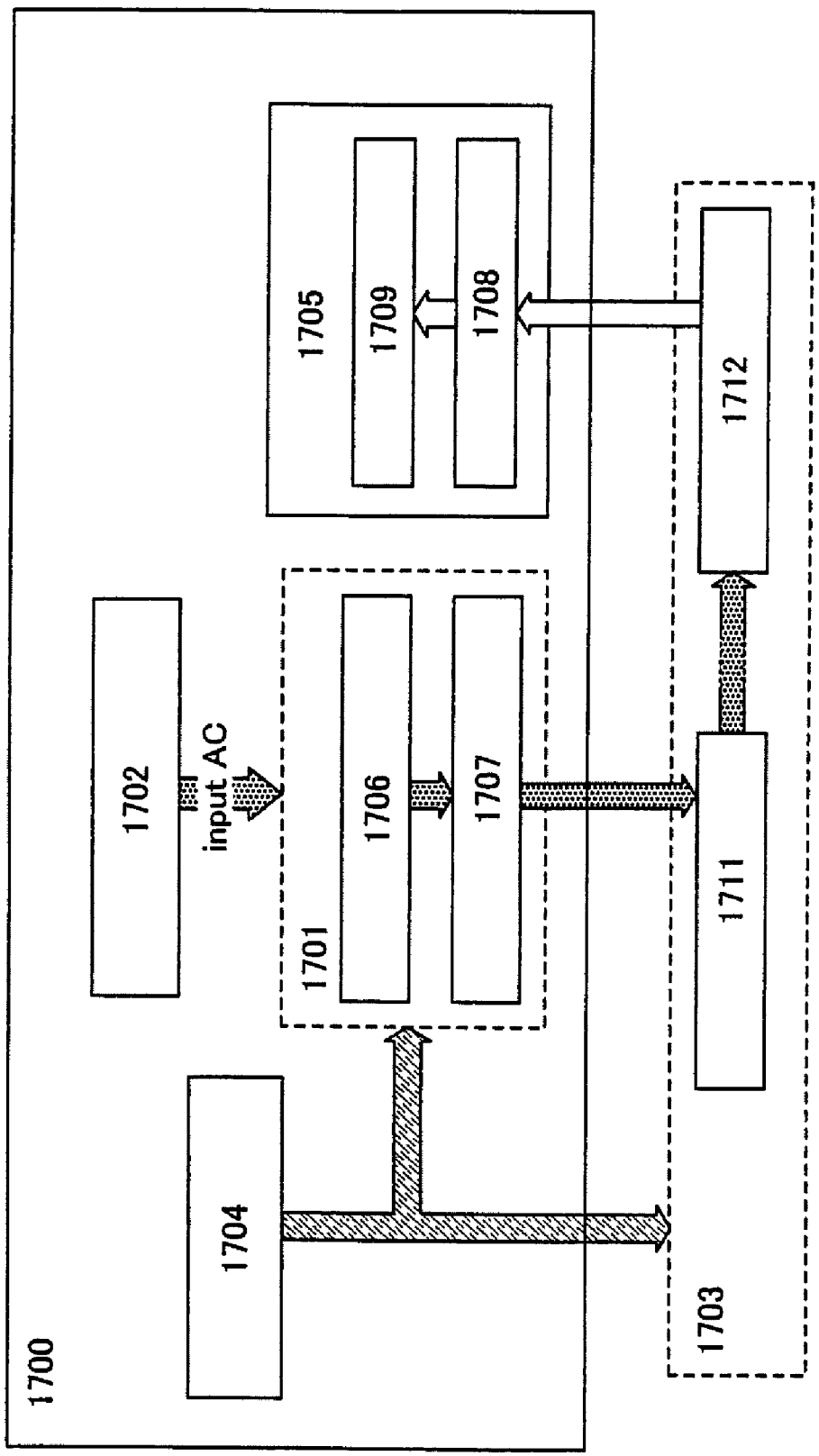
FIG. 17 is a block diagram of an inspection apparatus.

FIG. 17 is a block diagram of an inspection apparatus of the present invention. An inspection apparatus 1700 of the present invention shown in FIG. 17 includes an inspection substrate 1701, a signal source or AC power supply 1702, a means which allows the inspection substrate 1701 and a device substrate 1703 to be superimposed on each other so that a certain space is maintained therebetween (substrate fixing means 1704), and a means for identifying each defective spot by measuring an electric field or electromagnetic wave generated in an inspection dedicated circuit of the device substrate 1703 (inspection unit 1705).

It should be noted here that the signal source or AC power supply 1702 is regarded as a part of the inspection apparatus in this embodiment, although there is no problem even if the inspection apparatus of the present invention does not include the signal source or AC power supply 1702.

An AC signal generated in the signal source or AC power supply 1702 is inputted into an external input buffer 1706 of the inspection substrate 1701. The inputted AC signal is buffer-amplified in the external input buffer 1706 and is inputted into a primary coil forming unit 1707 of the inspection substrate 1701.

In the primary coil forming unit 1707, there is formed primary coils. Note that in a secondary coil forming unit 1711 of a device substrate 1703, there are formed secondary coils.

On the other hand, the inspection substrate 1701 and the device substrate 1703 are positioned by a substrate fixing means 1704 so that the primary coils of the primary coil forming unit 1707 and the secondary coils of the secondary coil forming unit 1711 are superimposed on each other, with a certain space being maintained therebetween.

Then, a power supply voltage or driving signal generated by an AC voltage that has been generated in the secondary coil forming unit 1711 is inputted into a circuit or circuit element 1712 of the device substrate 1703. Note that a circuit that is provided on the device substrate 1703 and generates the power supply voltage or driving signal has been described in detail in the embodiment mode of the present invention. Therefore, the description concerning this circuit is omitted in this embodiment.

Then, a measuring unit 1708 of the inspection unit 1705 measures the strength of the electromagnetic wave or electric field generated in the circuit or circuit element 1712. Following this, data (measured values) converted into numbers by measurement are sent to an operation unit 1709 of the inspection unit 1705.

The operation unit 1709 identifies each defective spot on the basis of the inputted data. In more detail, the operation unit 1709 judges each circuit element, in which there is generated an electric field or electromagnetic wave whose strength greatly differs from the strength of the electric field or electromagnetic wave generated in a normal circuit element, as a defective spot.

Several methods of comparing the strengths of electric fields or electromagnetic waves are listed below.

(1) A method with which comparison is performed between circuits or circuit elements provided on the same device substrate that is an inspection target.

(2) A method with which there is separately prepared a device substrate having a circuit or circuit element that has already been known as normal, there is measured the strength of an electromagnetic wave or electric field generated in a circuit or circuit element of this device substrate, data obtained by the measurement are stored in a memory or the like, there is measured an electric field or electromagnetic wave generated in a device substrate that is an inspection target, and the measurement result is compared with the data stored in the memory.

(3) A method with which the distribution of the strength of an electric field or electromagnetic wave in accordance with the positions on a device substrate is compared with a mask drawing.

It should be noted here that the comparison methods described above are just a few examples and therefore the present invention is not limited to them. That is, it is enough that there is detected each circuit element in which there is generated an electric field or electromagnetic wave whose strength greatly differs from the strength of the electric field or electromagnetic wave generated in a normal circuit element.

It should be noted here that each defective spot is identified by the inspection unit 1705 in this embodiment, although the inspection apparatus of the present invention is not limited to this structure. Instead of the inspection unit 1705, there may be used a means for visualizing the strength of an electromagnetic wave or electric field generated in the device substrate 1703 to make it possible to directly make a judgment about the strength of the electromagnetic wave or electric field using human's eyes.

It should be noted here that outputs from all circuits or circuit elements that are inspection targets are inputted into the inspection dedicated circuit. The inspection dedicated circuit includes a means for performing logical operation processing for a plurality of actuating signals inputted from the inspection targets and for outputting processing results as information concerning the operation states of the inspection targets (an operate state, a non-operate state, and a partial operate state). The inspection dedicated circuit also includes a means for amplifying the outputs.

In this embodiment, the inspection dedicated circuit includes a means for outputting a signal having a first level only in the case where levels of all inputted signals (heights of voltages) are approximately the same and for outputting a signal having a second level that is different from the signal having the first level in the case where there exists at least one signal having a different level. The inspection dedicated circuit also includes a means for amplifying the outputs.

Then, the amplified outputs are inputted into a predetermined terminal (pad) and the strength of an electric field or electromagnetic wave generated in the pad is measured. In this manner, there is confirmed the presence or absence of a defect in each circuit or circuit element that is an inspection target. Also, it is possible to narrow each area, in which there exists a defective spot, in accordance with the reduction of the number of circuits or circuit elements connected to one inspection dedicated circuit. It is possible to increase the number of circuits or circuit elements, for which the presence or absence of defects is confirmed by one measurement, in accordance with the increase of the number of circuits or circuit elements connected to one inspection dedicated circuit.

It is possible to carry out this embodiment by freely combining the structure of this embodiment with the structures of the first to sixth embodiments.

With the present invention, there are obtained the structures described above. This makes it possible to detect each defective spot without directly setting up probes on wiring. As a result, it becomes possible to prevent a situation where minute dust caused by the setting up of the probes reduces yield in the following steps. In addition, unlike the optical inspection method, it becomes possible to judge whether all pattern forming steps have been successfully done or not by a single inspection step. As a result, the inspection step is further simplified.

What is claimed is:
1. A semiconductor device comprising:
 a first circuit comprising a thin film transistor, wherein the first circuit is formed on a substrate;
 a second circuit comprising a resistor and a capacitor, wherein the second circuit is electrically connected to the first circuit and formed on the substrate;
 a coil for receiving an AC signal, wherein the coil is electrically connected to the second circuit and formed on the substrate; and a connecting terminal formed on the substrate,
wherein the connecting terminal is electrically connected to the first circuit, and
wherein the connecting terminal is connectable to an external power supply.

2. A device according to claim 1,
wherein an AC voltage is generated between two terminals of the coil by electromagnetic induction, and
wherein the AC voltage is shaped by the second circuit to form a driving signal, and then, supplied to the first circuit.

3. A device according to claim 1, wherein the first circuit comprises a shift register, a level shifter and an analog switch.

4. A device according to claim 1, wherein the substrate has an insulating surface.

5. The semiconductor device according to claim 1 is a display device.

6. A semiconductor device comprising:
a first circuit comprising a thin film transistor, wherein the first circuit is formed on a substrate;
a second circuit comprising a diode, a capacitor and a resistor, wherein the second circuit is electrically connected to the first circuit and formed on the substrate;
a coil for receiving an AC signal, wherein the coil is electrically connected to the second circuit and formed on the substrate; and
a connecting terminal formed on the substrate,
wherein the connecting terminal is electrically connected to the first circuit, and
wherein the connecting terminal is connectable to an external power supply.

7. A device according to claim 6,
wherein an AC voltage is generated between two terminals of the coil by electromagnetic induction, and
wherein the AC voltage is rectified by the second circuit to form a power supply voltage, and then, supplied to the first circuit.

8. A device according to claim 6, wherein the first circuit comprises a shift register, a level shifter and an analog switch.

9. A device according to claim 6, wherein the substrate has an insulating surface.

10. The semiconductor device according to claim 6 is a display device.

11. A semiconductor device comprising:
a driving circuit comprising a thin film transistor, wherein the driving circuit is formed on a substrate;
a coil for receiving an AC signal;
a rectifier circuit formed on the substrate for supplying a driving signal into the driving circuit in accordance with the AC signal; and
a connecting terminal formed on the substrate,
wherein the connecting terminal is electrically connected to the driving circuit,
wherein the connecting terminal is connectable to an external power supply,
wherein the coil is electrically connected to the rectifier circuit, and
wherein the driving circuit outputs information when the driving circuit is driven by the driving signal.

12. The semiconductor device according to claim 11, wherein the coil receives an AC signal in a non-contact manner.

13. The semiconductor device according to claim 11 is a display device.

14. A semiconductor device comprising:
a circuit comprising a thin film transistor, wherein the circuit is formed on a substrate;
a coil for receiving an AC voltage; and
a rectifier circuit formed on the substrate for supplying a power supply voltage into the circuit in accordance with the AC voltage; and
a connecting terminal formed on the substrate,
wherein the connecting terminal is electrically connected to the circuit,
wherein the connecting terminal is connectable to an external power supply,
wherein the coil is electrically connected to the rectifier circuit, and
wherein the circuit outputs information when the circuit is driven by the power supply voltage.

15. The semiconductor device according to claim 14, wherein the coil receives an AC voltage in a non-contact manner.

16. The semiconductor device according to claim 14 is a display device.

17. A semiconductor device comprising:
a driving circuit comprising a thin film transistor, wherein the driving circuit is formed on a substrate;
a coil for receiving an AC signal;
a rectifier circuit formed on the substrate for supplying a driving signal into the driving circuit in accordance with the AC signal; and
a connecting terminal formed on the substrate,
wherein the connecting terminal is electrically connected to the driving circuit,
wherein the connecting terminal is connectable to an external power supply,
wherein the coil is electrically connected to the rectifier circuit, and
wherein the driving circuit outputs an electromagnetic wave when the driving circuit is driven by the driving signal.

18. The semiconductor device according to claim 17, wherein the coil receives an AC signal in a non-contact manner.

19. The semiconductor device according to claim 17 is a display device.

20. A semiconductor device comprising:
a circuit comprising a thin film transistor, wherein the circuit is formed on a substrate;
a coil for receiving an AC voltage;
a rectifier circuit fowled on the substrate for supplying a power supply voltage into the circuit in accordance with the AC voltage; and
a connecting terminal formed on the substrate,
wherein the connecting terminal is electrically connected to the circuit,
wherein the connecting terminal is connectable to an external power supply,
wherein the coil is electrically connected to the rectifier circuit, and
wherein the circuit outputs an electromagnetic wave when the circuit is driven by the power supply voltage.

21. The semiconductor device according to claim 20, wherein the coil receives an AC voltage in a non-contact manner.

22. The semiconductor device according to claim 20 is a display device.

23. A semiconductor device comprising:
a driving circuit comprising a thin film transistor, wherein the driving circuit is formed on a substrate;

a coil for receiving an AC signal;
a circuit formed on the substrate for supplying a driving signal into the driving circuit in accordance with the AC signal; and
a connecting terminal formed on the substrate,
wherein the connecting terminal is electrically connected to the driving circuit,
wherein the connecting terminal is connectable to an external power supply,
wherein the coil is electrically connected to the circuit, and
wherein the driving circuit outputs information when the driving circuit is driven by the driving signal.

24. The semiconductor device according to claim 23, wherein the coil receives an AC signal in a non-contact manner.

25. The semiconductor device according to claim 23 is a display device.

26. A semiconductor device comprising:
a first circuit comprising a thin film transistor, wherein the first circuit is formed on a substrate; substrate;
a coil for receiving an AC voltage;
a second circuit formed on the substrate for supplying a power supply voltage into the first circuit in accordance with the AC voltage; and
a connecting terminal formed on the substrate,
wherein the connecting terminal is electrically connected to the first circuit,
wherein the connecting terminal is connectable to an external power supply,
wherein the coil is electrically connected to the second circuit, and
wherein the first circuit outputs information when the first circuit is driven by the power supply voltage.

27. The semiconductor device according to claim 26, wherein the coil receives an AC voltage in a non-contact manner.

28. The semiconductor device according to claim 26 is a display device.

29. A semiconductor device comprising:
a driving circuit comprising a thin film transistor, wherein the driving circuit is formed on a substrate;
a coil for receiving an AC signal;
a circuit formed on the substrate for supplying a driving signal into the driving circuit in accordance with the AC signal; and
a connecting terminal formed on the substrate,
wherein the connecting terminal is electrically connected to the driving circuit,
wherein the connecting terminal is connectable to an external power supply,
wherein the coil is electrically connected to the circuit, and
wherein the driving circuit outputs an electromagnetic wave when the driving circuit is driven by the driving signal.

30. The semiconductor device according to claim 29, wherein the coil receives an AC signal in a non-contact manner.

31. The semiconductor device according to claim 29 is a display device.

32. A semiconductor device comprising:
a first circuit comprising a thin film transistor, wherein the first circuit is formed on a substrate;
a coil for receiving an AC voltage;
a second circuit formed on the substrate for supplying a power supply voltage into the first circuit in accordance with the AC voltage; and
a connecting terminal formed on the substrate,
wherein the connecting terminal is electrically connected to the first circuit,
wherein the connecting terminal is connectable to an external power supply,
wherein the coil is electrically connected to the second circuit, and
wherein the first circuit outputs an electromagnetic wave when the first circuit is driven by the power supply voltage.

33. The semiconductor device according to claim 32, wherein the coil receives an AC voltage in a non-contact manner.

34. The semiconductor device according to claim 32 is a display device.

* * * * *

UNITED STATES PATENT AND TRADEMARK OFFICE
CERTIFICATE OF CORRECTION

| | | |
|---|---|---|
| PATENT NO. | : 7,902,845 B2 | Page 1 of 1 |
| APPLICATION NO. | : 12/437708 | |
| DATED | : March 8, 2011 | |
| INVENTOR(S) | : Masaaki Hiroki | |

It is certified that error appears in the above-identified patent and that said Letters Patent is hereby corrected as shown below:

Column 12, Line 10, Change "is" to --are--.

Column 17, Line 67, Change "are" to --is--.

Column 22, Claim 20, Line 47, Change "fowled" to --formed--.

Column 23, Claim 26, Line 20, Change "substrate; substrate;" to --substrate;--.

Signed and Sealed this
Twentieth Day of December, 2011

David J. Kappos
*Director of the United States Patent and Trademark Office*